US006278066B1

(12) United States Patent
Fahlen et al.

(10) Patent No.: US 6,278,066 B1
(45) Date of Patent: Aug. 21, 2001

(54) SELF-STANDING SPACER WALL STRUCTURES

(75) Inventors: Theodore S. Fahlen, San Jose; Alfred S. Conte, Hollister; Robert M. Duboc, Jr., Menlo Park; George B. Hopple, Palo Alto; John K. O'Reilly, Campbell; Vasil M. Chakarov; Robert L. Marion, both of San Jose; Steve T. Cho, Santa Clara; Robert G. Neimeyer, San Jose; Jennifer Y. Sun, Sunnyvale; David L. Morris, San Jose; Christopher J. Spindt, Menlo Park; Kollengode S. Narayanan, Cupertino, all of CA (US)

(73) Assignee: Candescent Technologies Corporation, San Jose, CA (US)

( * ) Notice: Subject to any disclaimer, the term of this patent is extended or adjusted under 35 U.S.C. 154(b) by 0 days.

(21) Appl. No.: 08/771,453

(22) Filed: Dec. 20, 1996

(51) Int. Cl.[7] .......................................................... H05K 1/11
(52) U.S. Cl. ................. 174/250; 174/138 G; 174/158 R; 313/422; 361/758; 361/770; 361/804
(58) Field of Search .................................... 313/422, 495, 313/496, 497, 582, 586; 174/138 G, 138 R, 250, 158 R; 316/758, 770, 804

(56) References Cited

U.S. PATENT DOCUMENTS

| | | | | |
|---|---|---|---|---|
| 3,022,973 | * | 2/1962 | Morrow et al. | 174/138 R |
| 3,645,389 | * | 2/1972 | Castiaux | 206/454 |
| 4,076,994 | * | 2/1978 | Anderson | 313/422 |
| 4,769,575 | * | 9/1988 | Murata et al. | 313/495 |
| 5,083,058 | | 1/1992 | Nonomura et al. | 313/482 |
| 5,134,338 | * | 7/1992 | Shiratori et al. | 313/422 |
| 5,227,691 | | 7/1993 | Murai et al. | 313/422 |
| 5,229,691 | * | 7/1993 | Shichao et al. | 313/422 X |
| 5,477,105 | | 12/1995 | Curtin et al. | 313/422 |
| 5,561,343 | | 10/1996 | Lowe | 313/482 |
| 5,614,781 | | 3/1997 | Spindt et al. | 313/422 |
| 5,650,690 | | 7/1997 | Haven | 313/422 |
| 5,675,212 | | 10/1997 | Schmid et al. | 313/422 |

FOREIGN PATENT DOCUMENTS

| | | | |
|---|---|---|---|
| 0 436 997 A1 | | 7/1991 | (EP) . |
| 0 464 938 A1 | | 1/1992 | (EP) . |
| 0 631 295 | * | 12/1994 | (EP) . |
| 0 780 873 A1 | | 6/1997 | (EP) . |

OTHER PUBLICATIONS

Andreadakis, N.C., et al., "Influence of Barrier Ribs on the Memory Margin of ac Plasma Display Panels," Proceedings of the SID, vol. 31/4, pp. 355–360, 1990.
Fujii, H., et al., "A Sandblasting Process for Fabrication for Color PDP Phosphor Screens," SID 92 Digest, pp. 728–731, 1992.
Takahashi, A., et al., "Back Modulation Type Flat CRT," Japan Display 1992, pp. 377–380, 1992.
Terao, Y., et al., "Fabrication of Fine Barrier Ribs for Color Plasma Display Panels by Sanblasting," SID 92 Digest, pp. 724–727, 1992.

* cited by examiner

*Primary Examiner*—Albert W. Paladini
(74) *Attorney, Agent, or Firm*—Skjerven Morrill MacPherson LLP; Ronald J. Meetin

(57) ABSTRACT

A spacer (100 or 600/1000A/1000B) situated between a faceplate structure (301) and a backplate structure (302) of a flat panel display is configured to be self standing. In one implementation, a pair of spacer feet (111 or 113 and 112 or 114) are located over the same face surface, or over opposite face surfaces, of a spacer wall (101) near opposite ends of the wall. An edge electrode (121 or 122) is located over an edge surface of the spacer adjacent to the faceplate structure or the backplate structure. In another implementation, a spacer clip (1000A or 1000B) clamps opposite face surfaces of a spacer wall (600) largely at one end of the wall.

77 Claims, 22 Drawing Sheets

SELF-STANDING SPACER WALL STRUCTURES

FIELD OF THE INVENTION

The present invention relates to spacer structures which are located between a faceplate structure and a backplate structure in a flat panel display. The present invention also relates to methods for fabricating and installing such spacer structures.

BACKGROUND OF THE INVENTION

Flat cathode ray tube (CRT) displays include displays which exhibit a large aspect ratio (e.g., 10:1 or greater) with respect to conventional deflected-beam CRT displays, and which display an image in response to electrons striking a light emissive material. The aspect ratio is defined as the diagonal length of the display surface to the display thickness. The electrons which strike the light emissive material can be generated by various devices, such as by field emitter cathodes or thermionic cathodes. As used herein, flat CRT displays are referred to as flat panel displays.

Conventional flat panel displays typically include a faceplate structure and a backplate structure which are joined by connecting walls around the periphery of the faceplate and backplate structures. The resulting enclosure is usually held at a vacuum pressure. To prevent collapse of the flat panel display under the atmospheric pressure, a plurality of spacers are typically located between the faceplate and backplate structures at a centrally located active region of the flat panel display.

The faceplate structure includes an insulating faceplate (typically glass) and a light emitting structure formed on an interior surface of the insulating faceplate. The light emitting structure includes light emissive materials, or phosphors, which define the active region of the display. The backplate structure includes an insulating backplate and an electron emitting structure located on an interior surface of the backplate. The electron emitting structure includes a plurality of electron-emitting elements (e.g., field emitters) which are selectively excited to release electrons. The light emitting structure is held at a relatively high positive voltage (e.g., 200 V to 10 kV) with respect to the electron emitting structure. As a result, the electrons released by the electron-emitting elements are accelerated toward the phosphor of the light emitting structure, causing the phosphor to emit light which is seen by a viewer at the exterior surface of the faceplate (the "viewing surface").

FIG. 1 is a schematic representation of the viewing surface of a flat panel display 50. The faceplate structure of flat panel display 50 includes a light emitting structure which is arranged in a plurality of rows of light emitting elements (i.e., pixel rows), such as pixel rows 1–31. Flat panel display 50 typically includes hundreds of pixel rows, with each row typically including hundreds of pixels.

The electron emitting structure of flat panel display 50 is arranged in rows of electron emitting elements which correspond with the pixel rows 1–31 of the faceplate structure. Each row of electron emitting elements includes electron emitting elements which correspond to each of the pixels on the light emitting structure. The electron emitting elements are activated, thereby causing electrons to be transmitted to the corresponding pixels to create an image at the viewing surface of the flat panel display 50.

Spacer walls 41–43 are located between the faceplate structure and the backplate structure. Pixel rows 1–31 and spacers walls 41–43 are greatly enlarged in FIG. 1 for purposes of illustration. It is desirable for spacers 41–43 to extend horizontally across display 50 in parallel with pixel rows 1–31. Spacer wall 41 is illustrated as a properly positioned spacer wall. Spacer wall 41 is perfectly located between pixel rows 8 and 9, such that the spacer wall 41 does not obstruct any of the pixels in pixel rows 8 and 9. While spacer wall 41 illustrates the ideal positioning of a spacer wall, spacer walls 42 and 43 illustrate the positioning which results from conventional methods. Spacer wall 42, although straight, is not located perfectly in parallel with pixel rows 16 and 17. As a result, spacer wall 42 obstructs pixels near the ends of pixel rows 16 and 17. The obstructed pixels will not receive the intended electrons from the electron emitting structure, thereby resulting in degradation of the image viewed by the user. Spacer wall 43 exhibits a waviness which may be inherent in the material used to make the spacer wall 43. Spacer wall 43 therefore obstructs pixels throughout pixel rows 24 and 25, again degrading the image seen by the viewer. Spacer walls 41–43 can also be positioned in a non-perpendicular manner between the faceplate and backplate structures. Such a non-perpendicular positioning can result in the undesirable deflection of electrons. This electron deflection can also degrade the image seen by the viewer.

Consequently, it is desirable to have spacer walls which are precisely aligned within the flat panel display. However, the relatively small size of the spacer walls 41–43 makes it difficult to position these spacer walls 41–43 between the faceplate and backplate structures. Even if the spacer walls 41–43 are initially aligned properly, these spacer walls 41–43 can subsequently shift out of alignment during normal operation of the flat panel display. This shifting may occur as a result of heating or physical shock experienced by the flat panel display.

Spacer walls 41–43 can include face electrodes which are used to control the voltage distribution between the faceplate and backplate structures adjacent to the spacers 41–43. Predetermined external voltages are applied to the face electrodes to control this voltage distribution. It is often difficult to make an electrical connection between these face electrodes and either the faceplate structure and the backplate structure, such that the external voltages can be applied to the face electrodes.

It would therefore be desirable to have a spacer structure which is easy to locate between a faceplate structure and a backplate structure. It would also be desirable if this spacer would remain in precise alignment after assembly of the flat panel display, even in view of exposure to thermal cycling and physical shock. It would further be desirable if such a spacer facilitated easy connection of face electrodes to the faceplate and/or backplate structures.

SUMMARY

Accordingly, the present invention provides a spacer structure which can be located between a faceplate structure and a backplate structure of a flat panel display. In one embodiment, the spacer structure includes a spacer wall having a first edge surface for contacting the faceplate structure and a second edge surface, opposite the first edge surface, for contacting the backplate structure. A first face surface extends between the first and second edge surfaces. A second face surface, which is located opposite the first face surface, extends between the first and second edge surfaces. The spacer wall further has a first end, and a second end located distal from the first end.

A first spacer foot is located on the first face surface at the first end of said spacer wall. The first spacer foot has a support surface which is co-planar with the first edge surface of the spacer wall. Similarly, a second spacer foot is located on the first face surface at the second end of said spacer wall. The second spacer foot has a support surface which is also co-planar with the first edge surface of the spacer wall. The first and second spacer feet advantageously enable the spacer wall to be supported in a free-standing position when the spacer wall is set on the first edge surface. To enhance the stability of the free-standing configuration of the spacer wall, the support surfaces of the first and second spacer feet are located perpendicular to the first and second face surfaces of the spacer wall. When the spacer wall is positioned between a faceplate structure and a backplate structure, the support surfaces contact the faceplate (or backplate) structure, thereby holding the spacer wall in a perpendicular configuration between the faceplate and backplate structures.

In an alternative embodiment, third and fourth spacer feet can be attached to the spacer wall. The third spacer foot is located on the second face surface at the first end of said spacer wall, and the fourth spacer foot is located on the second face surface at the second end of the spacer wall. Both the third and fourth spacer feet include support surfaces which are co-planar with the first edge surface of the spacer wall. These support surfaces are also perpendicular to the first and second face surfaces of the spacer wall. The third and fourth spacer feet provide additional stability to the spacer wall. The spacer feet can be made from various materials, including, but not limited to ceramic, glass, and/or glass frit.

One method of fabricating a spacer wall having attached spacer feet includes the steps of: (1) firing a ceramic wafer having a first face surface, a first edge and a second edge opposite the first edge, (2) applying a first strip of glass frit on the first face surface adjacent to the first edge, (3) applying a second strip of glass frit on the first face surface adjacent to the second edge, (4) firing the first and second strips of glass frit, and (5) cutting the ceramic wafer and first and second strips of glass frit into spacer strips from the first edge to the second edge. In this method, the strips of glass frit form the first and second spacer feet.

In an alternative embodiment, glass bars can be positioned on the first and second strips of glass frit prior to the step of firing the first and second strips of glass frit. In this embodiment, the glass bars combine with the glass frit to form the first and second feet. In yet another embodiment, the glass frit can be replaced by strips of ceramic. In yet another embodiment, fired ceramic strips can be glued to glass canes, which are subsequently melted to join the fired ceramic strips to the ceramic wafer.

A method of installing a spacer wall in a flat panel display is also described. This method includes the steps of (1) forming one or more spacer feet at opposing ends of the spacer wall, (2) positioning the spacer wall on the faceplate structure (or the backplate structure) of the flat panel display, and (3) holding the ends of the spacer wall on the faceplate (or backplate) structure with an electrostatic force introduced by a plurality of electrodes formed in the faceplate (or backplate) structure. By applying an electrostatic force to the ends of the spacer wall, the spacer wall is advantageously held in place during assembly of the flat panel display. Once the electrostatic force has been applied, the ends of the spacer wall can be bonded to the faceplate (or backplate) structure. The electrostatic force can be eliminated after the flat panel display has been assembled. The spacer wall can be inserted into a groove in the faceplate (or backplate) structure during installation to further promote the alignment of the spacer wall.

Another method of installing the spacer wall includes the steps of (1) heating the spacer wall to a predetermined temperature to lengthen the spacer wall, (2) attaching the ends of the heated spacer wall to the faceplate structure or the backplate structure, wherein the faceplate (or backplate) structure is at a temperature which is lower than the temperature of the heated spacer wall, and (3) allowing the attached spacer wall to cool, such that the spacer wall cools and contracts. When the spacer wall contracts, the spacer wall is pulled straight, thereby eliminating any inherent waviness in the spacer wall.

Yet another method of installing the spacer wall includes the steps of (1) forming the spacer wall from a material having a first coefficient of thermal expansion (CTE), (2) forming the faceplate (or backplate) structure of a material having a second CTE, wherein the first CTE is greater than the second CTE, (3) heating the spacer wall and the faceplate (or backplate) structure to a temperature above room temperature, (4) attaching the ends of the spacer wall to the faceplate (or backplate) structure, and (5) allowing the spacer wall and the faceplate (or backplate) structure to cool and contract, wherein the spacer wall contracts more than the faceplate (or backplate) structure, thereby pulling the wall straight and eliminating any inherent waviness in the spacer wall.

Yet another method includes the steps of: (1) cooling the faceplate (or backplate) structure, thereby causing the faceplate (or backplate) structure to contract, (2) attaching the ends of the spacer wall to the faceplate (or backplate) structure, wherein the faceplate (or backplate) structure is at a temperature which is lower than the temperature of the spacer wall, and (3) allowing the faceplate (or backplate) structure to heat, such that the faceplate (or backplate) structure expands. When the faceplate (or backplate) structure expands, the spacer wall is pulled straight, thereby eliminating any inherent waviness in the spacer wall.

An alternative method of installing the spacer wall includes the steps of: (1) attaching spacer feet at opposing ends of the spacer wall, (2) mechanically lengthening the spacer wall by applying a force between the spacer feet, (3) attaching the ends of the spacer wall to the faceplate (or backplate) structure, and (4) removing the applied force between the spacer feet. The force can be applied by mechanical screws, a piezoelectric element, or a high thermo-expansion alloy. This method introduces longitudinal tension in the spacer wall which tends to remove any inherent waviness in the spacer wall.

Yet another method of installing the spacer wall includes the steps of (1) causing the faceplate (or backplate) structure to contract prior to bonding the spacer wall to the faceplate (or backplate) structure, (2) bonding the ends of the spacer wall to the faceplate (or backplate) structure, and (3) allowing the faceplate (or backplate) structure to expand after the spacer wall is bonded to the faceplate (or backplate structure. The faceplate (or backplate) structure can be contracted by bending the faceplate (or backplate) structure into a concave configuration. This method also introduces a longitudinal tension in the spacer wall which tends to remove any inherent waviness in the spacer wall.

In yet another embodiment of the invention, the previously described spacer feet are replaced with spacer clips. Each spacer clip includes one or more spring-type elements which clamp the first and second face surfaces at an end of the spacer wall. The spacer clips can be made, for example, from an electrically conductive material, such as a metal, or from ceramic, glass, silicon, thermoplastic, or another dielectric material. Electrically conductive spacer clips can be used to provide an electrical connection to face electrodes located on the spacer wall. The spacer wall can be free-floating within the spacer clips, or affixed to the spacer clips in accordance with different embodiments of the invention. If the spacer wall is free-floating within the spacer clips, the spacer wall is free to expand and contract within the spacer clips, without distorting the spacer wall. If the spacer wall is affixed to the spacer clips, longitudinal tension can be introduced into the spacer wall by lengthening the spacer wall prior to affixing the spacer clips to the faceplate (or backplate) structure of the flat panel display, and then allowing the spacer wall to shorten after the spacer clips have been attached.

In yet another embodiment of the present invention, a spacer clip includes a ribbon of electrically conductive material which is bonded to the faceplate (or backplate) structure using a wirebonding process. The ribbon is bonded to form two adjacent loops which define a channel. During installation, the spacer wall is fitted into the channel.

The present invention will be more fully understood in view of the following detailed description taken together with the drawings.

DETAILED DESCRIPTION

The following definitions are used in the description below. Herein, the term "electrically insulating" (or "dielectric") generally applies to materials having a resistivity greater than $10^{12}$ ohm-cm. The term "electrically non-insulating" thus refers to materials having a resistivity below $10^{12}$ ohm-cm. Electrically non-insulating materials are divided into (a) electrically conductive materials for which the resistivity is less than 1 ohm-cm and (b) electrically resistive materials for which the resistivity is in the range of 1 ohm-cm to $10^{12}$ ohm-cm. These categories are determined at low electric fields.

Examples of electrically conductive materials (or electrical conductors) are metals, metal-semiconductor compounds, and metal-semiconductor eutectics. Electrically conductive materials also include semiconductors doped (n-type or p-type) to a moderate or high level. Electrically resistive materials include intrinsic and lightly doped (n-type or p-type) semiconductors. Further examples of electrically resistive materials are cermet (ceramic with embedded metal particles) and other such metal-insulator composites. Electrically resistive materials also include conductive ceramics and filled glasses.

Figure 2:
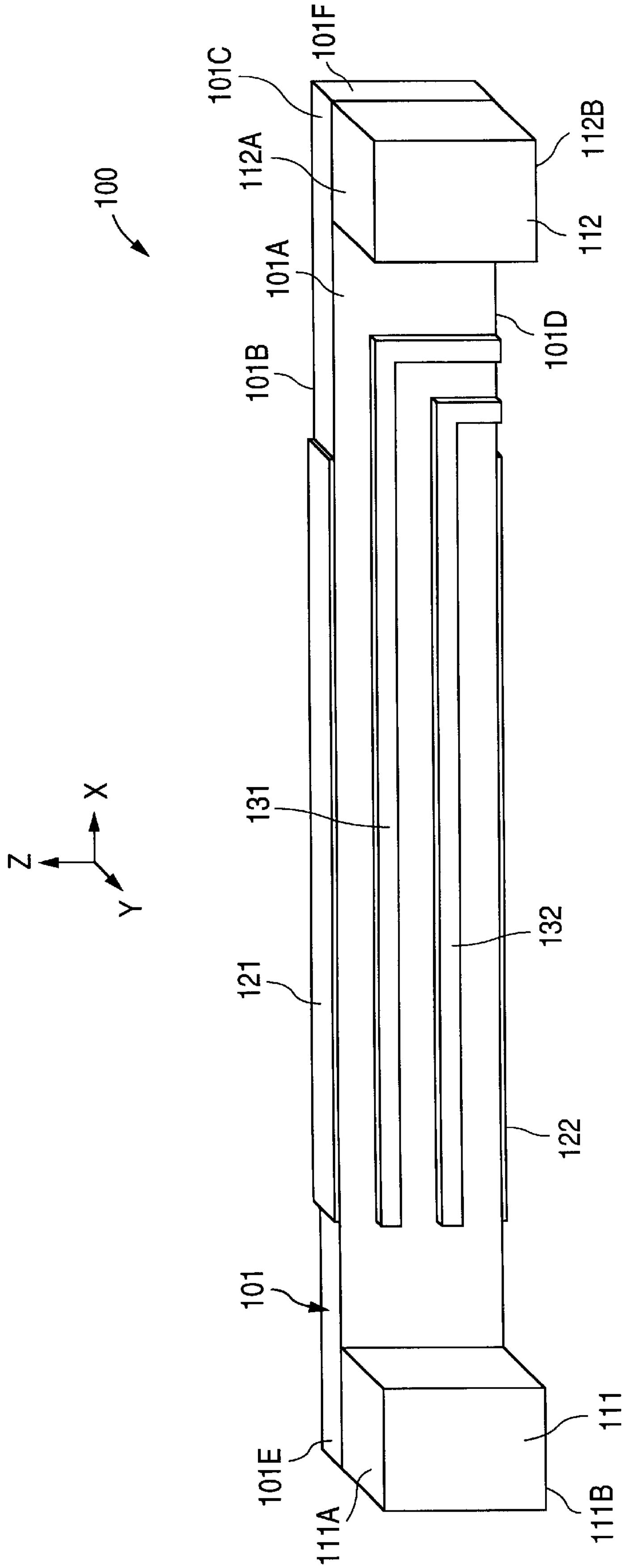
FIG. 2 is an isometric view of a spacer wall in accordance with one embodiment of the invention.

FIG. 2 is an isometric view of a spacer wall 100 in accordance with one embodiment of the invention. Spacer wall 100 includes a main spacer body 101, spacer feet 111 and 112, edge electrodes 121 and 122, and face electrodes 131 and 132. Spacer wall 100 is adapted to be located between the faceplate structure and a backplate structure of a flat panel display. In the described embodiment, spacer body 101 is made of a ceramic, such as alumina, which has one or more transition metal oxides, such as chromia or titania, dispersed throughout the ceramic. In general, spacer body 101 is electrically resistive, with a resistivity on the order of $1\times10^9$ Ω-cm, and has a secondary electron emission coefficient of less than 2 at 1 kV. Various compositions which can be used to form spacer body 101 are described in more detail in commonly owned, co-pending U.S. patent application Ser. No. 08/414,408, "Spacer Structures for Use in Flat Panel Displays and Methods for Forming Same" by Schmid et al., filed Mar. 31, 1995, now U.S. Pat. No. 5,675,212; and U.S. patent application Ser. No. 08/505,841, "Structure and Operation of High Voltage Supports" by Spindt et al., filed Jul. 20, 1995, now U.S. Pat. No. 5,614,781, both of which are hereby incorporated by reference in their entirety.

In the described embodiment, spacer body 101 has dimensions of 5 cm along the X-axis, 60 μm along the Y-axis and 1.3 mm along the Z-axis. In other embodiments, spacer body 101 can have other dimensions, consistent with the requirements of the spacer wall 100.

Spacer body 101 has a first face surface 101A, a second face surface 101B, a first edge surface 101C and a second edge surface 101D. Spacer body 101 further has a first end 101E and a second end 101F. Face electrodes 131 and 132 are electrically conductive elements which are located on the first face surface 101A. Face electrodes 131 and 132 are typically made from a metal, such as chrome-nickel. Face electrodes 131 and 132 extend in parallel with the first and second edge surfaces 101C and 101D (i.e., along the X-axis), and then extend down (i.e., along the Z-axis) to the second edge surface 101D. As described in more detail below, the first and second face electrodes 131 and 132 are connected to an external voltage source to control the voltage distribution along the spacer wall 100 (along the Z-axis). The structure and operation of the face electrodes 131 and 132 are described in more detail in U.S. patent application Ser. No. 08/414,408.

Edge electrodes 121 and 122 are electrically conductive elements which are located on the first and second edge surfaces 101C and 101D, respectively, of spacer body 101. Edge electrodes 121 and 122 are typically made from a metal, such as chrome-nickel. When the spacer wall 100 is positioned between a faceplate structure and a backplate structure of a flat panel display, edge electrodes 121 and 122 contact the faceplate and backplate structures. The edge electrodes 121 and 122 provide for uniform voltages along the first and second edge surfaces 101C and 101D, respectively, of the spacer body 101. The structure and operation of edge electrodes 121 and 122 are described in more detail in U.S. patent application Ser. Nos. 08/414,408 and 08/505,841.

Spacer wall 100 further includes spacer feet 111 and 112, which are located on face surface 101A of the spacer body 101. Spacer feet 111 and 112 are located at the first end 101E and the second end 101F, respectively, of the spacer body 101. Spacer feet 111 and 112 are dimensioned to support the spacer wall 100 in a free-standing position. That is, spacer feet 111 and 112 prevent spacer wall 100 from falling over when the spacer wall 100 is set on first edge surface 101C or second edge surface 101D. Moreover, spacer feet 111 and 112 ensure that the spacer body 101 held in a perpendicular configuration (with respect to the surface on which the spacer wall 100 is sitting). In the described embodiment, each of spacer feet 111 and 112 has dimensions of approximately 2.5 mm along the X-axis, 1 mm along the Y-axis, and 1.3 mm along the Z-axis. Surfaces 111A and 112A of spacer feet 111 and 112 are co-planar with the first edge surface 101C of the spacer body 101. Similarly, surfaces 111B and 112B of spacer feet 111 and 112 are co-planar with the second edge surface 101D of the spacer body. As a result, spacer feet 111 and 112 support spacer wall 100 in an upright position when spacer wall 100 is resting on surfaces 101C, 111A and 112A (or 101D, 111B and 112B).

Surfaces 111A and 112A of spacer feet 111 and 112 are perpendicular with first face surface 101A and second face surface 101B of the spacer body 101. Similarly, surfaces 111B and 112B of spacer feet 111 and 112 are perpendicular with first face surface 101A and second face surface 101B of the spacer body 101. As described in more detail below, spacer feet 111 and 112 facilitate the perpendicular installation of the spacer wall 101 between a faceplate structure and a backplate structure of a flat panel display. When the spacer wall 101 is located between a faceplate structure and a backplate structure, the spacer feet 111 and 112 contact the faceplate and backplate structures. As a result, the spacer wall 101 is held between the faceplate and backplate structures, such that the first and second face surfaces 101A and 101B of the spacer body 101 are perpendicular with respect to the faceplate and backplate structures.

Figure 3:
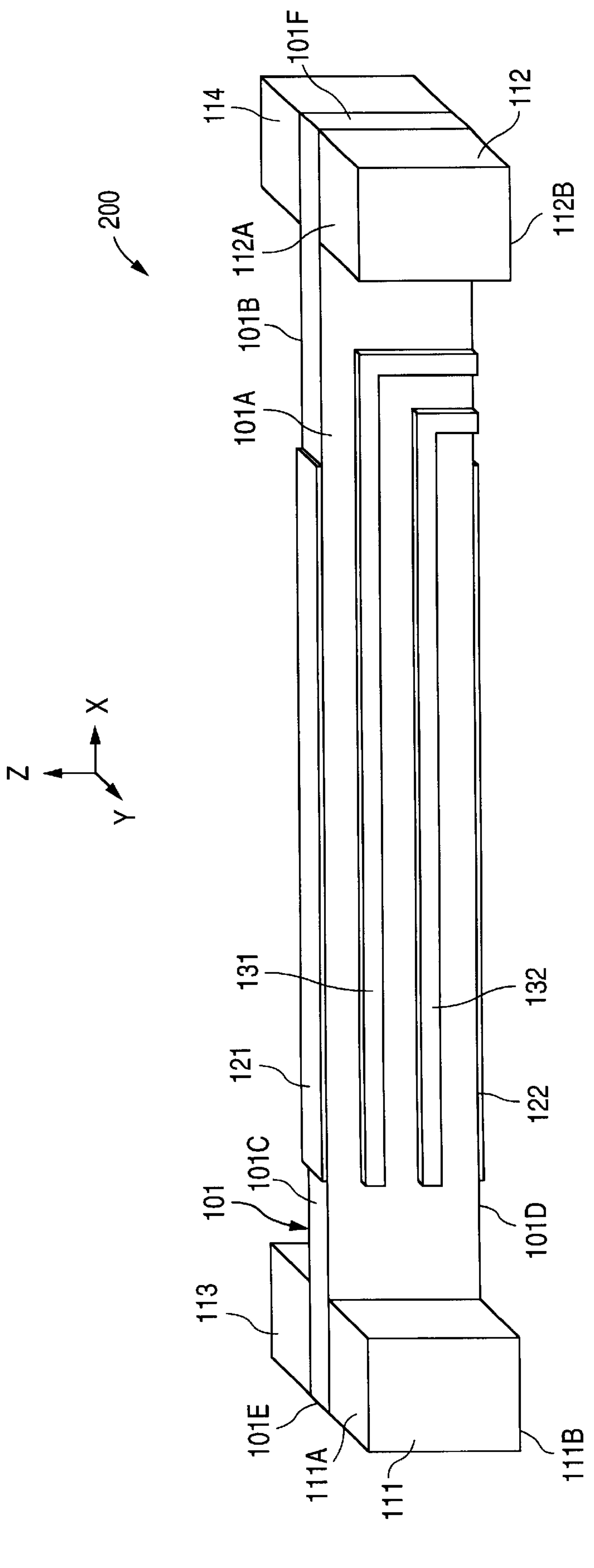
FIG. 3 is an isometric view of a spacer wall in accordance with another embodiment of the invention.

FIG. 3 is an isometric view of a spacer wall 200 in accordance with another embodiment of the invention Because spacer wall 200 is substantially identical to spacer wall 100 (FIG. 2), similar elements of spacer walls 200 and 100 are labeled with similar reference numbers. Spacer wall 200 additionally includes spacer feet 113 and 114. Spacer feet 113 and 114 are located on face surface 101B of spacer wall 200, with spacer foot 113 being positioned at the first end 101E of the spacer body 101, and spacer foot 114 being positioned at the second end 101F of the spacer body 101. Spacer feet 113 and 114, which are substantially identical to spacer feet 111 and 112, improve the ability of spacer wall 200 to perform as a free-standing structure by adding structural stability to the spacer wall structure Spacer feet 113 and 114 further promote the perpendicular placement of the spacer wall 200 between corresponding faceplate and backplate structures.

Figure 4:
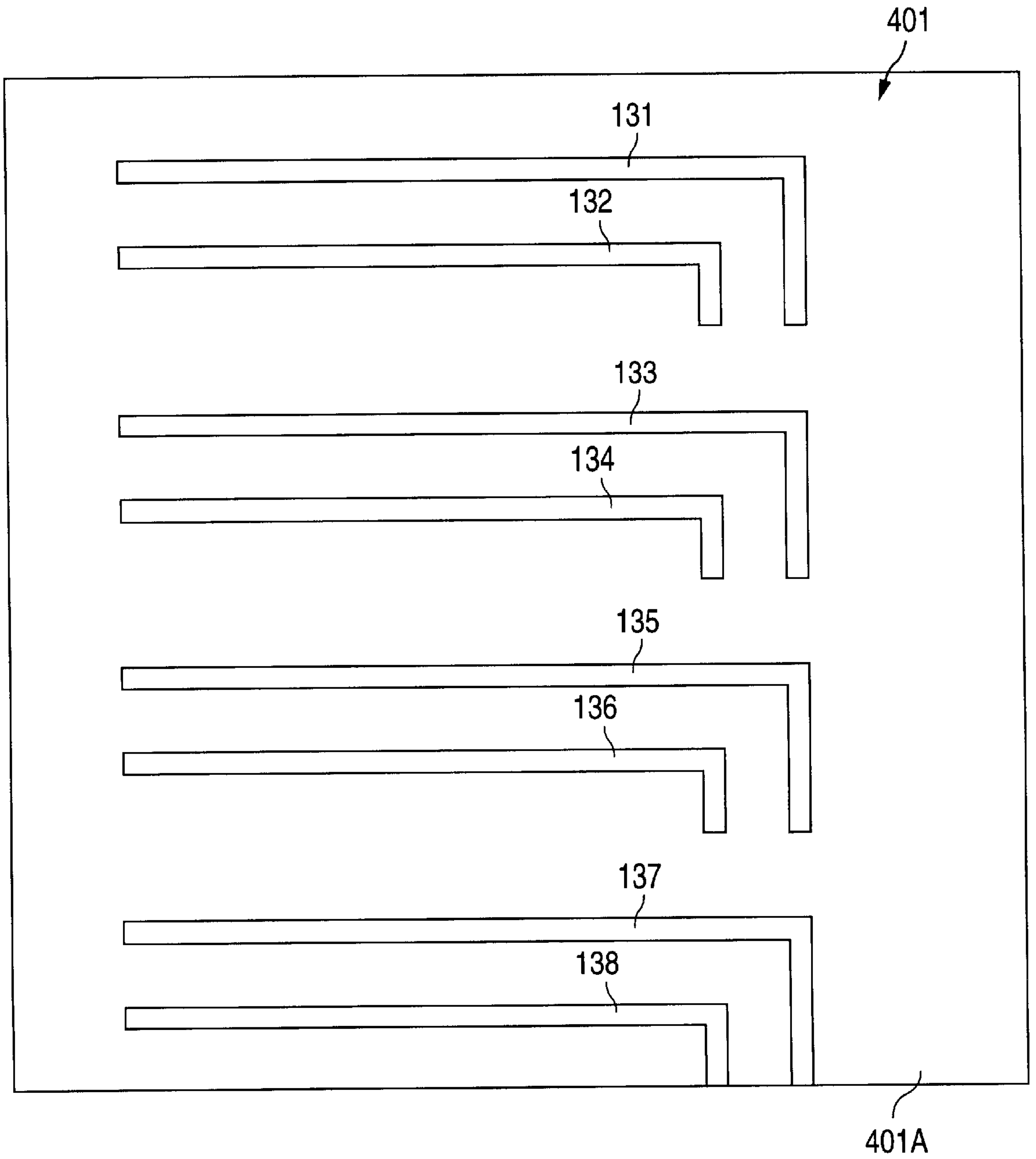
FIGS. 4 and 5 are top views of the spacer wall of FIG. 2 during selected processing steps.

Methods of manufacturing spacer walls 100 and 200 in accordance with various embodiments of the invention will now be described. FIGS. 4–8 are diagrams illustrating selected process steps used to form spacer walls 100 and 200. As illustrated in FIG. 4, a ceramic wafer 401 is formed and fired. In the described embodiment, the ceramic wafer 401 has a composition of approximately 34% alumina, 64% chromia and 2% titania. Again, the composition and manufacture of ceramic wafer 401 is described in more detail in U.S. patent application Ser. No. 08/414,408.

Face electrodes 131–138 are formed on face surface 401A of the fired wafer 401 as illustrated. In one embodiment, face electrodes 131–138 are formed by sputtering a blanket layer of a metal, such as chrome-nickel, over the entire face surface 401A of wafer 401. A photoresist mask having a pattern which defines the face electrodes 131–138 is then formed over the blanket metal layer. A metal etch is then performed to remove the undesired portions of the metal layer. The photoresist mask is then stripped, thereby leaving the face electrodes 131–138. Alternatively, face electrodes 131–138 can be formed by sputtering metal through a mask which is attached to the fired wafer 401.

Figure 5:
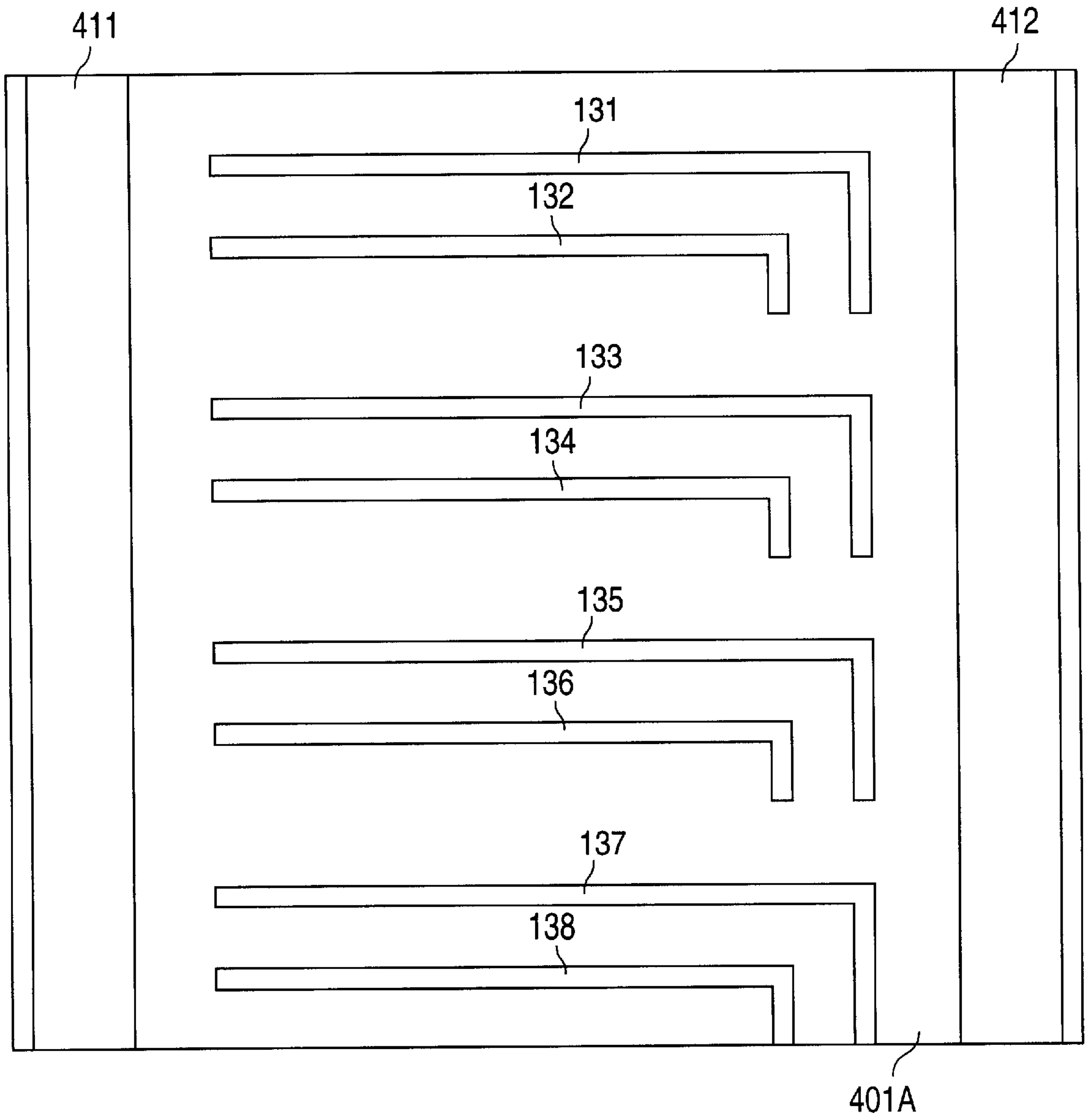

Turning now to FIG. 5, sealing glass (also referred to as glass frit) is used to form continuous frit bars 411 and 412 near the edges of the wafer 401. Frit bars 411 and 412 can be formed by applying glass frit with a conventional dispenser or a screen printer. Alternatively, frit bars 411 and 412 can be pre-formed bars of glass frit which are placed on wafer 401. The glass frit used to form the frit bars 411 and 412 is electrically insulating and has a coefficient of thermal expansion (CTE) which is matched to the CTE of the fired wafer 401. In one embodiment the CTE of the wafer 401 and the glass frit is approximately 7.2 ppm/° C. The frit bars 411 and 412 have a thickness of approximately 1 mm.

The resulting structure is fired at a temperature to densify and sinter the frit bars 411 and 412. In one embodiment, this firing step is performed at a temperature of approximately 450° C. In an alternative embodiment, a pair of glass bars (not shown) are placed on the frit bars 411 and 412 prior to the firing step. After the firing step is completed, the frit bars 411 and 412 bond the glass bars to the wafer 401. In yet another alternative, the frit bars 411 and 412 are replaced with a pair of glass bars. In this embodiment, the glass bars are fired to attach the glass bars directly to the wafer 401 (by melting). The resulting structure is substantially equivalent for all three alternatives. In yet another embodiment, the frit bars 411 and 412 are replaced by ceramic strips having the same composition as the wafer 401. These ceramic strips are laminated on the wafer 401 and fired at the same time as the wafer 401. In yet another embodiment, the ends of a fired ceramic bar are glued to the ends of a glass cane. The glass cane is then placed on the ceramic wafer 401. The resulting structure is heated to 520° C., such that the glass cane melts and bonds the ceramic bar to the ceramic wafer 401. A second set of frit bars 413 and 414 can be formed on the back surface 401B of the wafer 401 in the same manner as previously described for frit bars 411 a and 412 (See FIG. 7).

Figure 6:
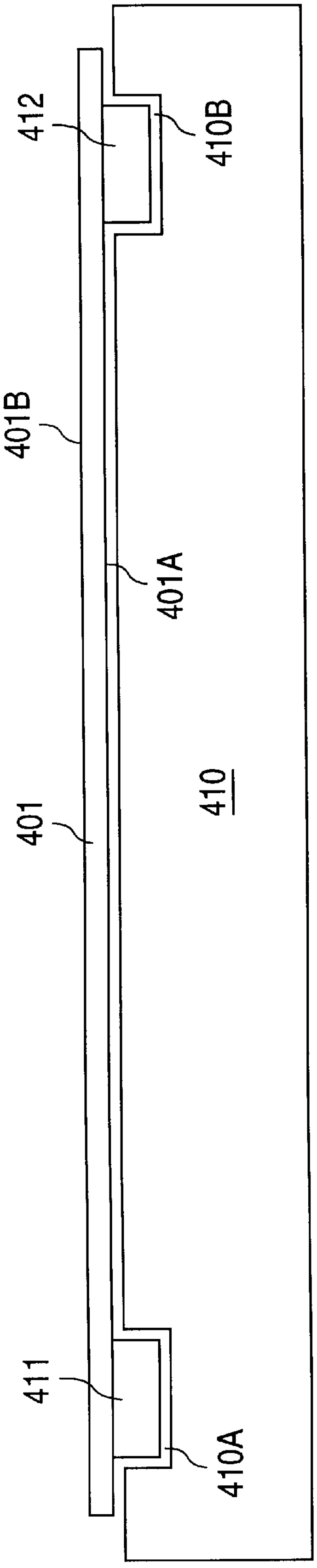
FIGS. 6 and 7, are cross sectional views of the spacer walls of FIGS. 2 and 3 during selected processing steps.
Figure 7:
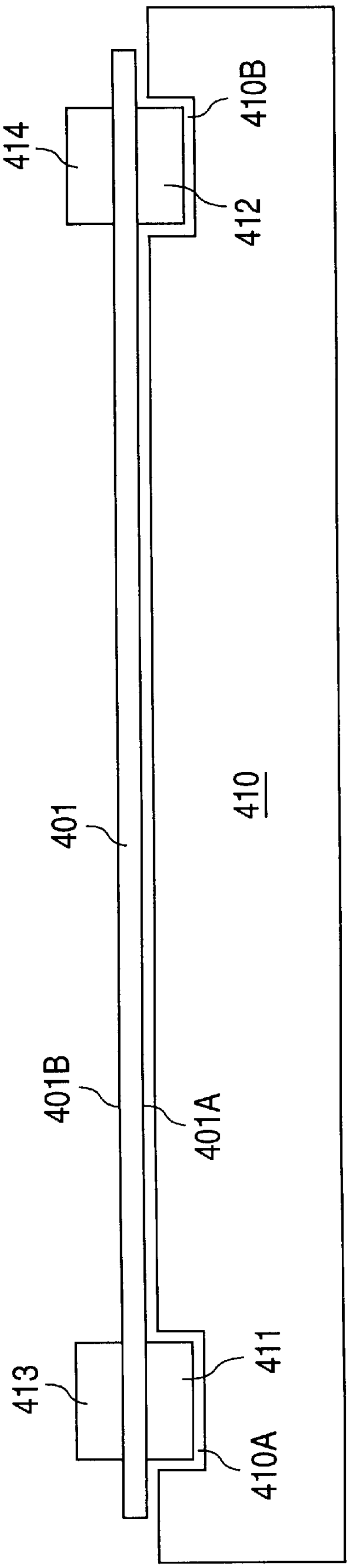

The resulting structure is then bonded to a glass substrate 410 as illustrated in FIG. 6 or, when frit bars 413 and 414 are present, as illustrated in FIG. 7 such that surface 401A of the wafer 401 is positioned on the glass substrate 410. In the described embodiment, this bonding is performed by heating a wax material located at the interface of the wafer 401 and the glass substrate 410. The glass substrate 410 includes grooves 410A and 410B for receiving the fired frit bars 411 and 412. The glass substrate 410 ensures that the wafer 401 is maintained in a flat configuration. When bonded to the glass substrate 410, the back surface 401B of the wafer 401 is exposed. As a result, the face electrodes 131–138 can be formed on the back surface 401B, rather than the front surface 401A, of wafer 401. In this variation, the face electrodes 131–138 are not formed until after the wafer 401 is bonded to the substrate 410. Face electrodes 131–138 are fabricated using the process steps previously described, but on surface 401B, instead of surface 401A. In this variation as applied to the structure of FIG. 6, the tolerances between the locations of frit bars 411 and 412 and the locations of face electrodes 131–138 are not of concern, since the frit bars 411–412 and the face electrodes 131–138 are fabricated on opposite surfaces of the wafer 401.

A protective coating (not shown) is applied over the back surface 401B of the wafer 400. In one embodiment, this protective coating is Microposit, which is commonly available from Shipley, Inc., and has a thickness of approximately 0.003 cm. The purpose of the protective coating is to minimize chipping during a subsequent dicing step, and to form a mask for subsequently sputtering edge electrodes.

Figure 8:
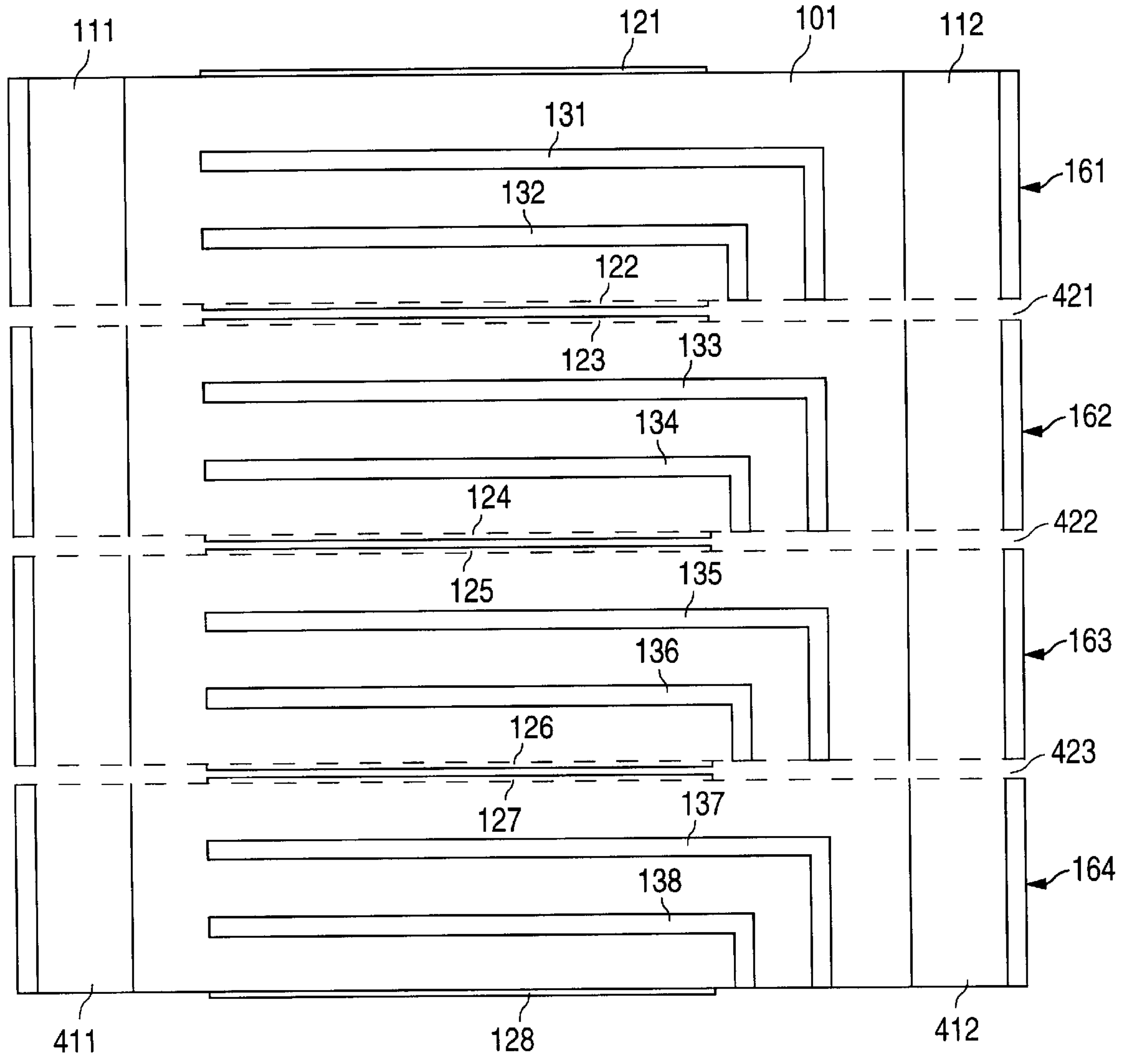
FIG. 8 is a top view of the spacer wall of FIG. 2 during a selected processing step.

The resulting structure is diced into a plurality of spacer wall strips 161–164. The dicing step is performed while the substrate 401 is still bonded to the glass substrate 410. FIG. 8 illustrates the lines 421–423 along which the wafer 401 is diced. This dicing step results in the formation of spacer feet, such as spacer feet 111 and 112, at the ends of each of the spacer wall strips 161–164. This dicing step further results in the formation of spacer bodies, such as spacer body 101. Forming the edge surfaces of the spacer bodies and the spacer feet by the same cut ensures that the supporting surfaces of the spacer feet are co-planar with the edge surfaces of the spacer bodies. The dicing step is performed such that the supporting surfaces of the spacer feet are perpendicular to the face surfaces of the spacer bodies.

Edge electrodes 121–128 are applied to the spacer wall strips 161–164 while the spacer wall strips 161–164 are still bonded to the glass substrate 410. These edge electrodes 121–128 can be formed by forming a mask over the spacer wall strips 161–164 to define the locations of the edge electrodes 121–128, and then sputtering the edge electrodes through the mask. An angled sputtering process is used, such that the edge electrodes 121–128 are only formed on the edge surfaces of the spacer wall strips 161–164. A first angled sputtering operation is used to form edge electrodes 121, 123, 125 and 127, and a second angled sputtering operation (from the opposite direction) is used to form edge electrodes 122, 124, 126 and 128. The dicing step creates spaces between the spacer wall strips 161–164 which are sufficient to enable the edge electrodes 121–128 to be formed while the spacer wall strips 161–164 are still connected to the glass substrate 410. The resulting spacer walls are de-mounted from the glass substrate 410 using a solvent, such as acetone, to dissolve the wax material which holds the spacer walls to the substrate 410, thereby completing the fabrication of spacer walls.

Figure 9:
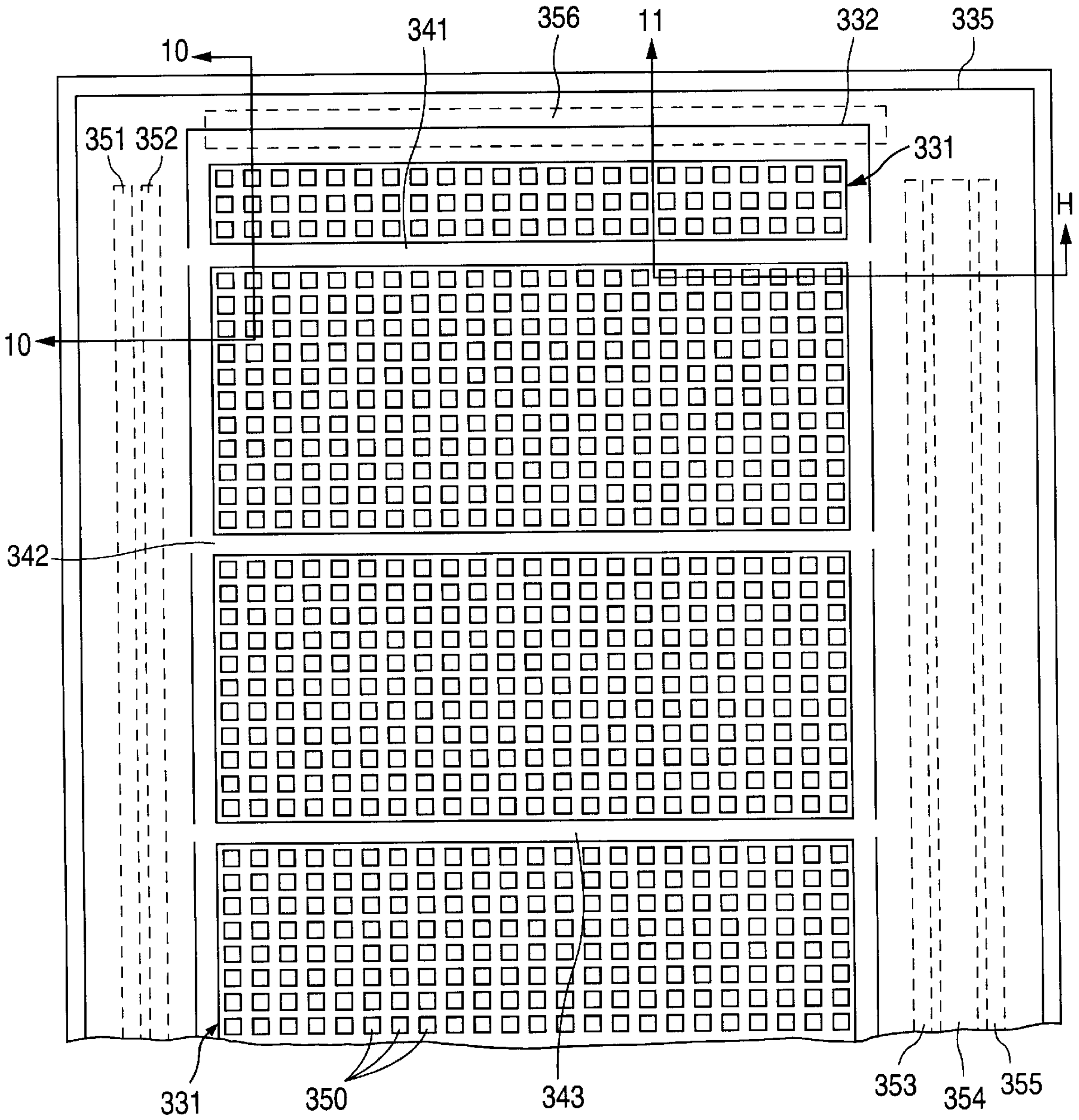
FIG. 9 is a schematic bottom view of a portion of a faceplate structure in accordance with one embodiment of the present invention.
Figure 10:
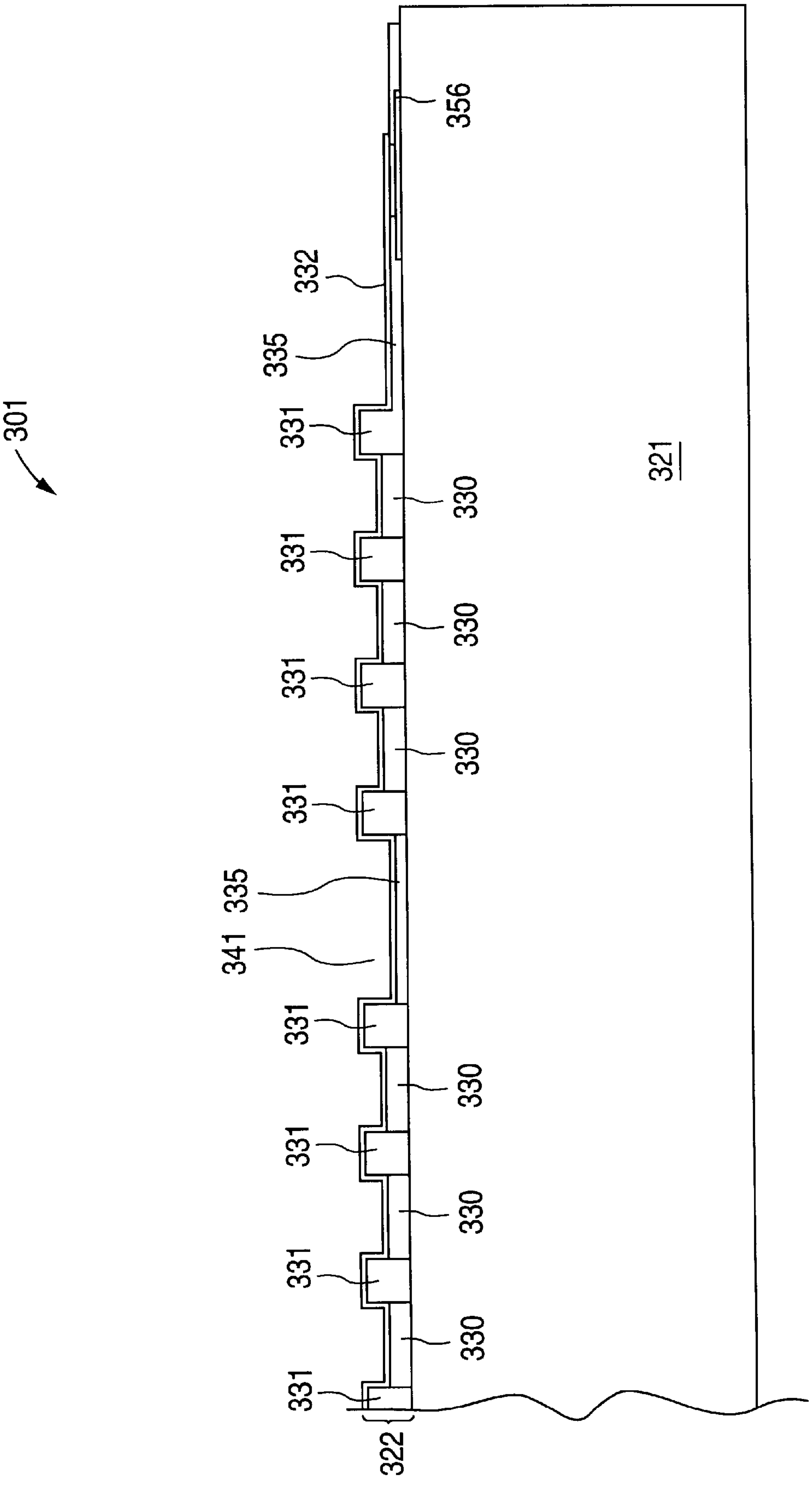
FIG. 10 is a cross sectional view of the faceplate structure of FIG. 9 along section line 10—10 of FIG. 9.
Figure 11:
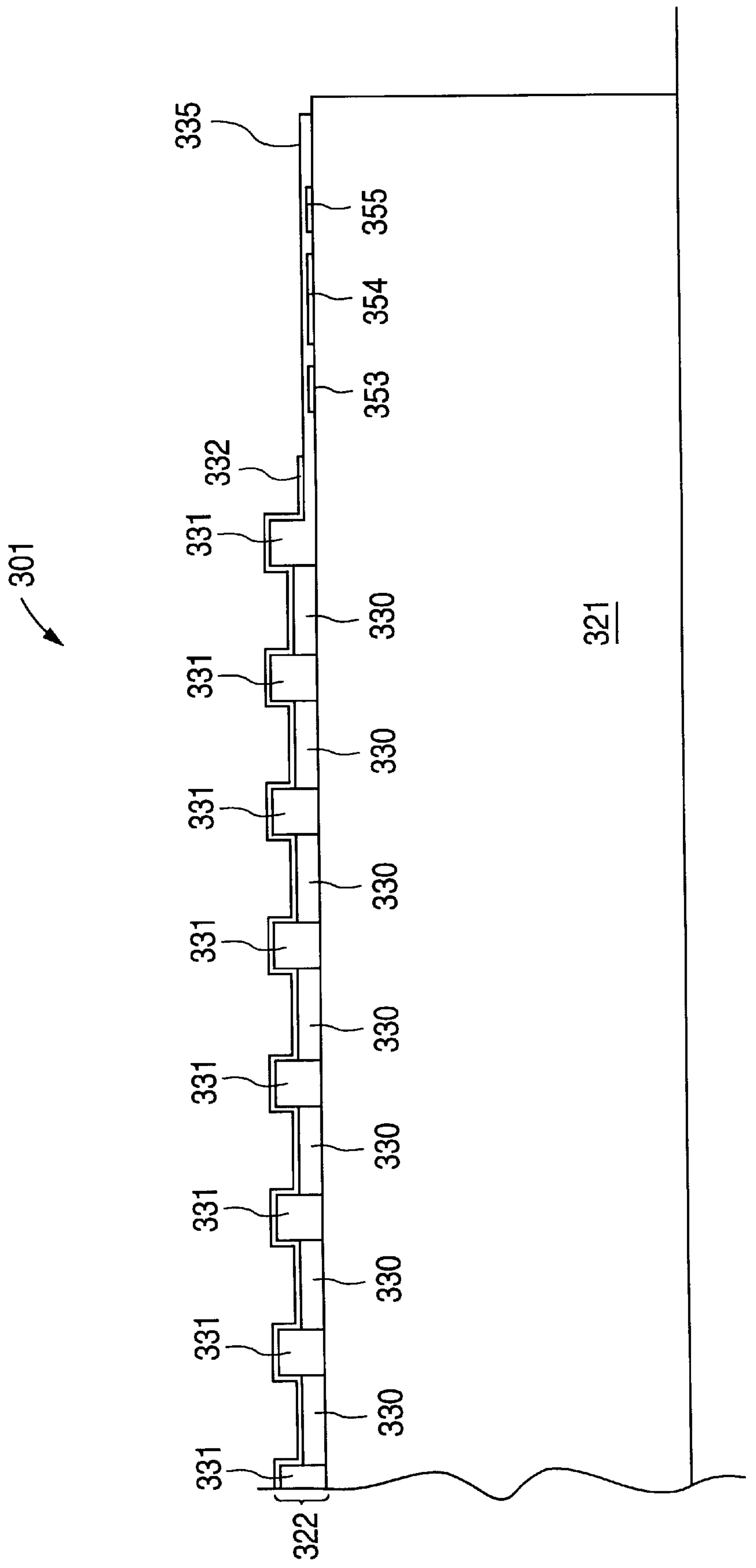
FIG. 11 is a cross sectional view of the faceplate structure of FIG. 9 along section line 11—11 of FIG. 9.

Methods for installing spacer wall 200 between a faceplate structure and a backplate structure of a flat panel display will now be described. It is understood that similar methods can be used to install spacer wall 100. A faceplate structure for receiving the spacer walls 200 is described below. FIG. 9 is a schematic bottom view of a portion of a faceplate structure 301 in accordance with one embodiment of the present invention. FIG. 10 is a cross sectional view of faceplate structure 301 along section line 10—10 of FIG. 9. FIG. 11 is a cross sectional view of faceplate structure 301 along section line 11—11 of FIG. 9. The schematic view of FIG. 9 illustrates the faceplate structure 301 as having a length which is greater than its width for purposes of illustration only. It is understood that faceplate structure 301 typically has a width which is greater than its length.

Faceplate structure 301 includes an electrically insulating faceplate 321 (typically glass) and a light emitting structure 322 formed on an interior surface of the insulating faceplate 321. The light emitting structure 322 includes a raised black matrix 331 which is located over the active region of the faceplate structure 301. The raised black matrix 331 is made of a dielectric material, such as polyimide. Matrix 331 has a height of approximately 50 $\mu$m, and includes a plurality of pixel openings 350 and a plurality of matrix gaps 341–343 (FIG. 9). As described in more detail below, matrix gaps 341–343 receive the spacer walls 200. Although only three gaps 341–343 are illustrated in FIG. 9, it is understood that more than three gaps will typically be present in the faceplate structure 301. Moreover, it is understood that the matrix gaps 341–343 have been given an exaggerated width for purposes of illustration. In faceplate structure 301, the width of each of matrix gaps 341–343 is less than or equal to the spacing between the adjacent pixels (as defined by openings 350). The spacer walls 200, in turn, are thinner than the matrix gaps 341–343. This enables the installed spacer walls 200 to be invisible to the viewer. In one embodiment, the gaps 341–343 extend parallel to each other with a lateral spacing of 1 cm.

Light emissive materials, or phosphors 330, are located in the pixel openings 350 of the matrix 331, such that these light emissive materials 330 are positioned on the insulating faceplate 321 (FIGS. 10, 11). A thin reflective metal layer 332 is located over the matrix 331 and the light emissive materials 330. The reflective metal layer 332 is typically aluminum having a thickness of approximately 500 to 1500 Å.

The light emitting structure 322 further comprises a plurality of metal electrodes 351–356 which are formed on the faceplate 321, and a thin polyimide layer 335 which surrounds the polyimide matrix 331 outside of the active region. Note that the insulating faceplate 321 is exposed near the edges of the faceplate structure 301, thereby facilitating the subsequent joining of the faceplate structure 301 to a corresponding backplate structure. Electrodes 351–356 are deposited on the glass faceplate 321 using a convention thin film processes, such as sputtering and photolithography. Electrodes 351–356 are formed from aluminum or an aluminum alloy having a thickness of approximately 0.5 $\mu$m. The thin polyimide layer 335, which has a thickness of approximately 16 microns, extends over electrodes 351–356. As described in more detail below, electrodes 351–355 are used to provide an electrostatic tacking force which holds the spacer walls 200 in position during assembly of the flat panel display, and to provide connections to the face electrodes 131 and 132 of the spacer walls 200.

As illustrated in FIG. 10, the reflective metal layer 332 is electrically connected to electrode 356 by a conductive via which extends through the thin polyimide layer 335. Although not illustrated, electrode 356 extends to a power supply circuit which effectively applies a voltage of several kilo-Volts to the reflective metal layer 332 during normal operation of the resulting flat panel display. Electrodes 353, 354 and 355 are illustrated in FIG. 11. These electrodes are described in more detail below.

More detailed information relating to faceplate structure 301 is described in more detail in commonly owned U.S. Pat. No. 5,477,105; and PCT Publication No. WO 95/07543, published Mar. 16, 1995, which are hereby incorporated by reference in their entirety.

Figure 12:
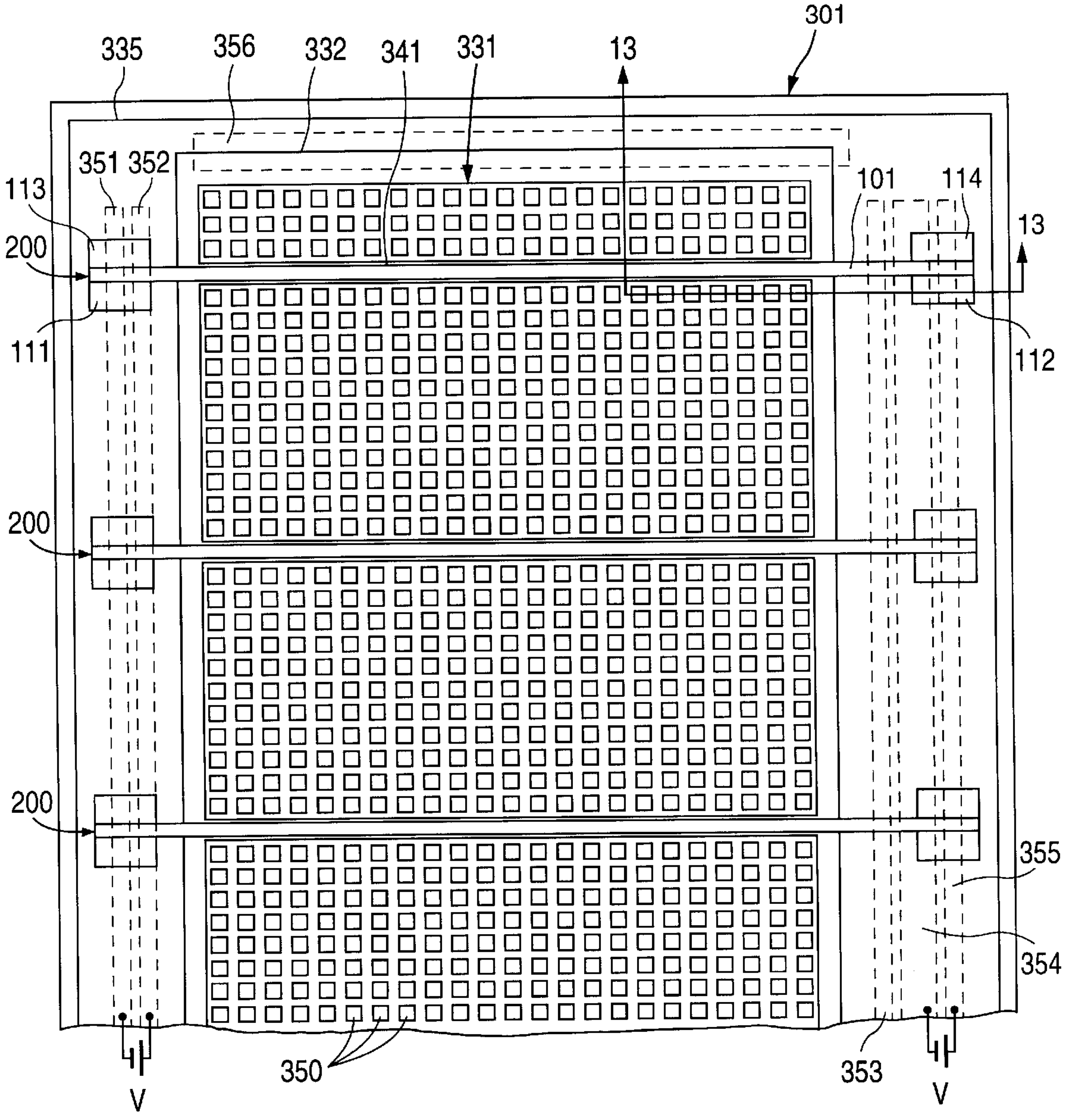
FIG. 12 is a schematic bottom view of the faceplate structure of FIG. 9 after spacer walls have been applied.

To install spacer walls 200 on the faceplate structure 301, the spacer walls 200 are fitted into the matrix gaps 341–343 as illustrated in FIG. 12. The matrix gaps 341–343 are dimensioned such that the surrounding matrix 331 may apply a slight gripping force to the spacer walls 200. The placement of the spacer walls 200 into the matrix gaps 341–343 is an automated process which uses a vacuum wand or vacuum end effector to pick up the spacer walls 200 and place them in the appropriate matrix gap.

As illustrated in FIG. 12, the spacer feet 112 and 114 of each of the spacer walls 200 are located over electrodes 354 and 355. Similarly, the spacer feet 111 and 113 of each of the spacer walls 200 are located over electrodes 351 and 352. A voltage V is applied across electrodes 354 and 355 to generate an attractive electrostatic force P between the electrodes 354 and 355 and the spacer feet 112 and 114. This force P as a function of the voltage V can be calculated from the following relationship:

$$P=C^2V^2/(2\epsilon A^2),$$

where P is equal to pressure (force) in pascals, C is equal to capacitance in farads between the spacer feet 112 and 114 and electrodes 354 and 355, V is equal to the voltage in volts, $\epsilon$ is equal to the relative dielectric constant of polyimide (3.5) and A is equal to the area in meters squared between the spacer feet 112 and 114 and electrodes 354 and 355. Pressures in the range of approximately 34 kPa to 103 kPa can be developed for applied voltages in the range of 500 to 1100 volts in the described embodiment. The electric fields generated at these voltages are on the order of 2 kV/mil, which is well below the reported dielectric breakdown strength of polyimide (~6 kV/mil).

The electrostatic force P effectively tacks the spacer walls 200 to the faceplate structure 301. The electrostatic force P is typically generated within seconds (i.e., the time required to charge the polyimide). The electrostatic force P is maintained during connection of the faceplate structure 301 to a corresponding backplate structure, thereby ensuring that the spacer walls 200 do not move while this connection is made. After the faceplate structure 321 has been joined with a corresponding backplate structure, the voltage V can be removed.

In a similar manner a voltage V is applied across electrodes 351 and 352 to generate an electrostatic force which holds spacer feet 111 and 113 at the other ends of spacer walls 200. In an alternative embodiment, electrodes 351 and 352 are eliminated, such that only one end of each spacer wall is tacked by an electrostatic force.

The tacking electrodes 351–352 and 354–355 advantageously eliminate the need for mechanical fixturing or organic adhesives to hold the spacer walls 200 during assembly of the faceplate and backplate structures. The organic adhesives are typically difficult to apply and require time to cure. Moreover, organic adhesives can migrate in the active region of the flat panel display, thereby degrading performance. Mechanical fixtures are time consuming to position and engage, and tend to be bulky.

Figure 12A:
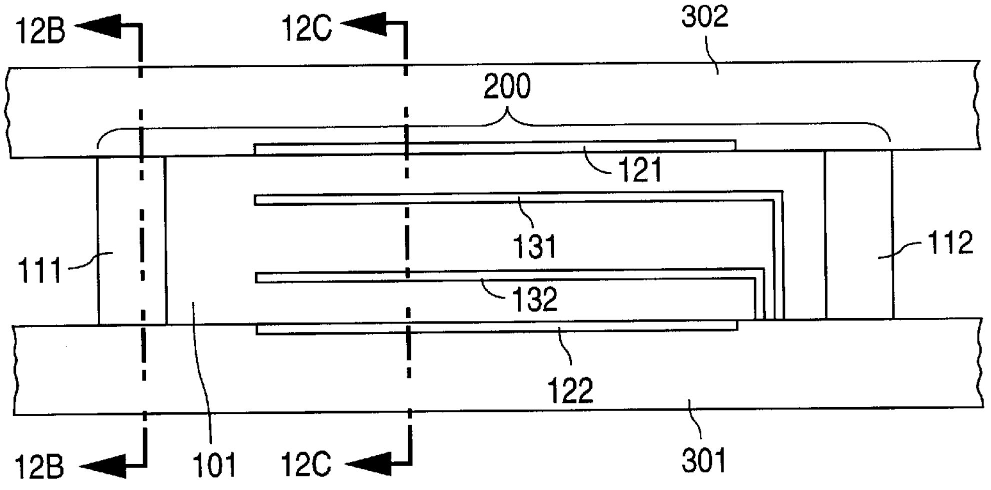
FIG. 12A is a front cross sectional view of a portion of a flat panel display in which multiple spacer walls configured as shown in FIG. 12 are situated between a faceplate structure and a backplate structure of the display.
Figure 12B:
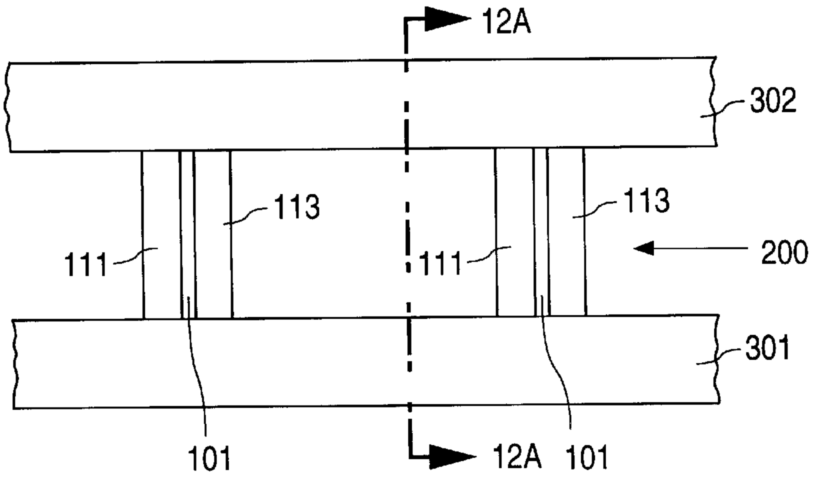
FIGS. 12B and 12C are side cross sectional views of the portion of the flat panel display of FIG. 12A taken respectively along section lines 12B—12B and 12C—12C in FIG. 12A; the front cross section of FIG. 12A is taken along section line 12A—12A in FIGS. 12B and 12C.
Figure 12C:
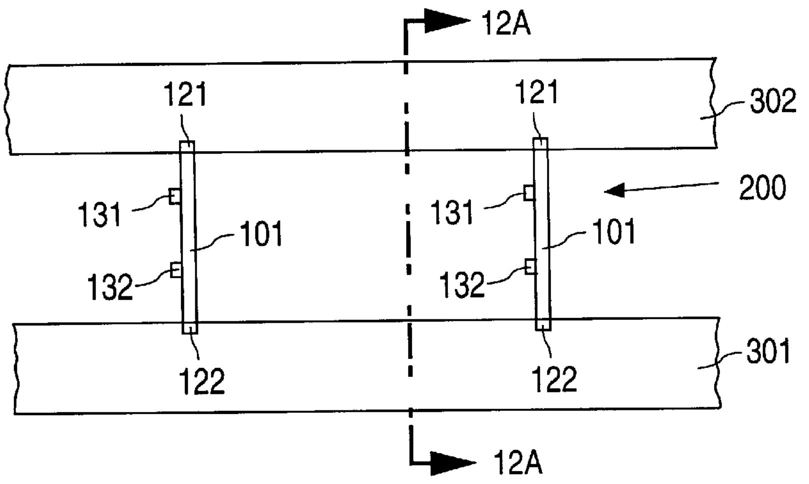

FIG. 12A presents a front cross section of a portion of a flat panel display configured according to the invention. The flat panel display of FIG. 12A is formed with faceplate structure 301, a backplate structure 302, and a group of spacer walls 200 provided with spacer feet 111 and 112, edge electrodes 121 and 122, and face electrodes 131 and 132. Each spacer wall 200 is situated between faceplate structure 301 and backplate structure 302 so that edge electrodes 121 and 122 of each spacer wall 200 contact structures 301 and 302. FIGS. 12B and 12C present side cross sections of the portion of the flat panel display shown in FIG. 12A. FIGS. 12B and 12C are taken respectively along section lines 12B—12B and 12C—12C of FIG. 12A. FIG. 12A is taken along section line 12A—12A of FIGS. 12B and 12C.

Figure 13:
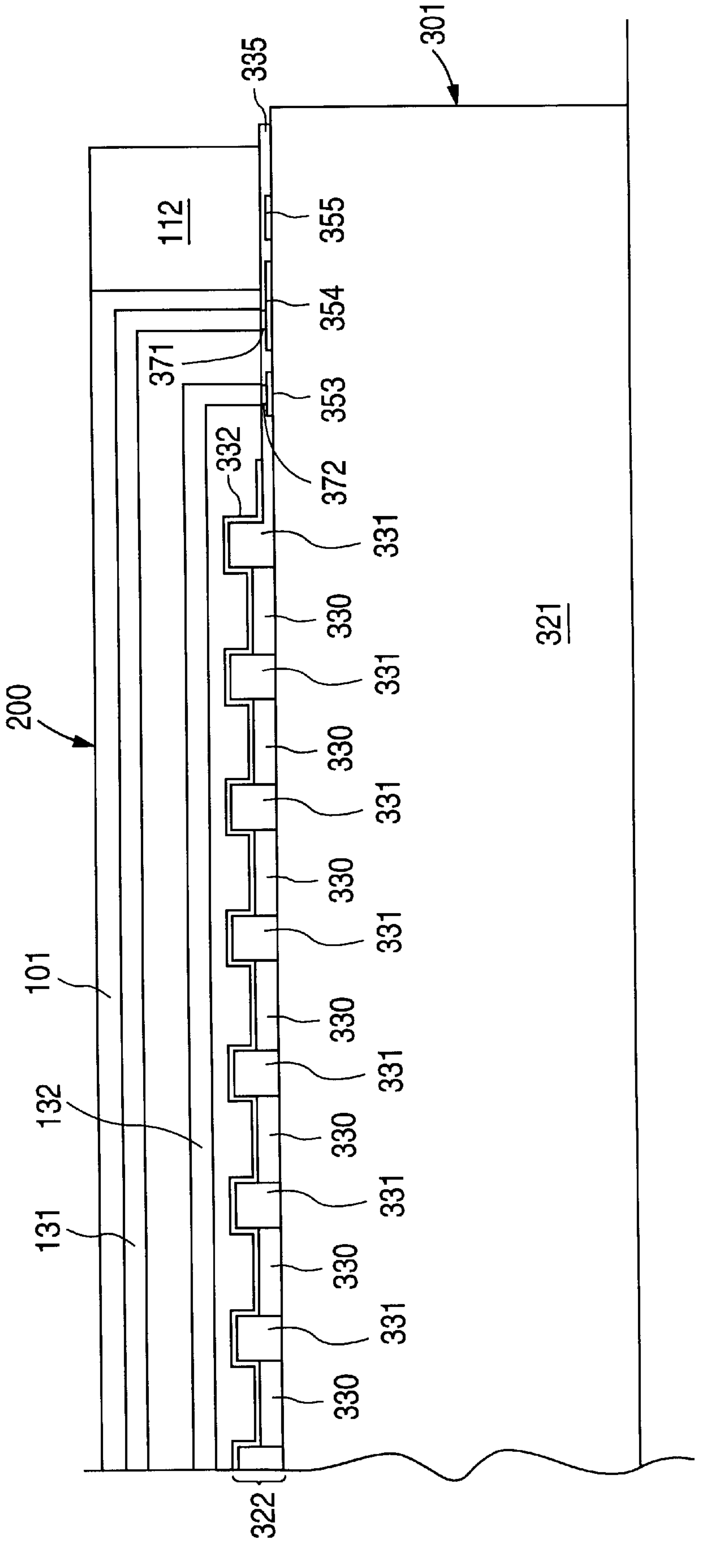
FIG. 13 is a cross sectional view of the faceplate structure and spacer wall of FIG. 12 along section line 13—13 of FIG. 12.

FIG. 13 is a cross sectional view of the faceplate structure 301 and spacer wall 200 along section line 13—13 of FIG. 12. As illustrated in FIG. 13, electrode 354, in addition to performing a tacking function, can also provide an electrical connection to face electrode 131 of the spacer wall 200. Note that electrode 353 provides an electrical connection to face electrode 132. These electrical connections are provided by gold bumps 371 and 372 which are positioned in openings in the thin polyimide layer 335. Pressure, heat and/or ultrasonic energy can be applied to gold bumps 371 and 372 to cause these bumps to join the face electrodes 131 and 132 to the corresponding electrodes 354 and 353. Gold bumps 371 and 372 provide a further tacking force between the faceplate structure 301 and the spacer wall 200. The tacking forces provided by the gold bumps 371 and 372 hold the spacer wall 200 in place after the flat panel display has been assembled, and the electrostatic force is no longer applied. If the tacking forces provided by the gold bumps 371 and 372 are insufficient to tack the spacer walls 200, an adhesive can additionally be applied at one or both of the ends of spacer walls 200. Gold bumps 371 and 372 can be replaced with a gold alloy, such as indium-gold or tin-gold. In other variations, the gold bumps 371 and 372 can be replaced by a metal impregnated epoxy or by wire bonds.

Electrodes 353 and 354 may be connected to a power supply (not shown) which controls the voltages on face electrodes 131 and 132. By controlling the voltages on face electrodes 131 and 132, the voltage distribution between the faceplate and backplate structures can be controlled adjacent to the spacer walls.

In another embodiment of the invention, the tacking electrodes 351, 352 and 355 are not provided on the faceplate structure 301 (electrode 354 is retained to provide a connection for face electrode 131). In this embodiment, the spacer walls 200 are initially heated to a preset temperature, such that the lengths of the spacer walls 200 are increased. The spacer walls 200 have a CTE of approximately $7.2\times10^{-6}$/° C. Thus, the previously described spacer walls 200 will expand approximately 36 $\mu$m along the X-axis when raised to a temperature which is 100° C. above room temperature.

The heated spacer walls 200 are then positioned in matrix gaps 341–343 of the faceplate structure. Both ends of the heated spacer walls 200 are attached to the faceplate structure 301 using an adhesive, such as EPO-TEK P-1011 (without metal filler), available from Epoxy Technology Inc. At the time that the heated spacer walls 200 are attached to the faceplate structure 301, the faceplate structure 301 is at room temperature. The spacer walls 200 are then allowed to cool. Upon cooling, the spacer walls 200 contract, thereby creating tension stress within the spacer walls 200. This tension stress tends to pull each of the spacer walls 200 into a straight configuration. The stress developed is defined by Hook's law:

$$E=\sigma/\epsilon,$$

where E is the elastic modulus of the spacer wall ($2.3\times10^{11}$ Pa), $\sigma$ is the stress in pascals, and $\epsilon$ is the strain in the spacer wall ($3.6\times10^{-4}$ cm/cm). In the described embodiment, the tension stress introduced to the spacer walls 200 is approximately $8.3\times10^{7}$ Pa (which is less than the tensile strength of the spacer wall 200). This is a reasonable upper limit for preloading the spacer walls 200.

In a variation of this embodiment, the spacer walls 200 are formed of a material having a first coefficient of thermal expansion (CTE), and the insulating faceplate 321 of the faceplate structure 301 is formed of a material having a second CTE, wherein the first CTE is greater than the second CTE. Both the spacer walls 200 and the faceplate structure 301 are heated to a temperature above room temperature, such that the spacer walls 200 and the faceplate structure 301 expand. Because the spacer walls 200 have a higher CTE than the faceplate structure 301, the spacer walls 200 expand more than the faceplate structure 301. While the spacer walls 200 and faceplate structure 301 are still heated, the ends of the spacer walls 200 are then attached to the faceplate structure 301. The spacer walls 200 and the faceplate structure 301 are then allowed to cool. Upon cooling, the spacer walls 200 contract more than the faceplate structure 301. As a result, an internal tension is introduced into the spacer walls 200 which tends to pull the spacer walls 200 straight and eliminates any inherent waviness in the spacer walls 200.

In another embodiment, the faceplate structure 301 is cooled prior to attachment of the spacer walls 200, thereby causing the faceplate structure 301 to contract. The ends of the spacer walls 200, which are maintained at room temperature, are then affixed to the cooled faceplate structure 301, and the faceplate structure 301 is allowed to warm to room temperature. Upon warming, the faceplate structure 301 expands, thereby introducing a tension stress into the spacer walls 200 which tends to pull the spacer walls 200 straight.

The faceplate structure 301 can be cooled by various methods. In one embodiment, the faceplate structure 301 is cooled as follows. First the insulating faceplate 321 of the faceplate structure 301 is placed on a surface of a flat aluminum platen which has one or more holes. A negative pressure is introduced through the holes, such that the faceplate 321 is held securely on the surface of the aluminum platen. A liquid, such as ethylene glycol or alcohol, is chilled by a conventional cooling structure and run through channels which extend through the aluminum platen, thereby cooling the aluminum platen (and the attached faceplate structure 301). Ethylene glycol and alcohol exhibit freezing temperatures of approximately −20° C. to −30° C., thereby enabling the faceplate structure 301 to be cooled to a temperature substantially below room temperature (~20° C. to 25° C.). In other embodiments, other liquids can be used to cool the aluminum platen.

In yet another embodiment, the spacer walls 200 can be expanded mechanically (rather than thermally) prior to attachment to the faceplate structure 301. This mechanical expansion can be implemented using an expanding fixture which is positioned between the spacer feet 111 and 112 (or spacer feet 113 and 114), and forces the spacer feet 111 and 112 away from one another along the X-axis. The expanding fixture can be implemented by using mechanical screws, piezoelectric devices, or a high thermoexpansion alloy. The mechanically expanded spacer wall 200 is affixed to the faceplate structure 301 at both ends of the spacer wall 200 after the spacer wall 200 has been loaded to a predefined amount. After the spacer wall 200 has been affixed to the faceplate structure 301, the expanding fixture is removed from the spacer wall 200, thereby introducing tension strain into the spacer wall 200.

Figure 14:
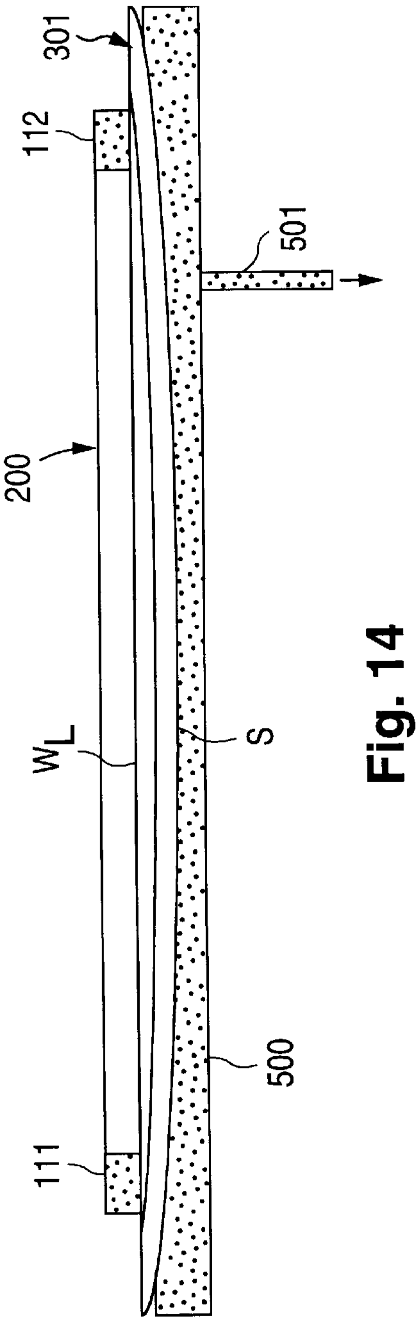
FIG. 14 is a schematic diagram illustrating the attachment of a spacer wall to a faceplate structure in accordance with one embodiment of the invention.

In yet another embodiment of the invention, the faceplate structure 301 is bent into a concave configuration prior to attaching the spacer walls 200. FIG. 14 is a schematic diagram illustrating this method. Faceplate structure 301 is initially placed in a curved vacuum chuck 500. A vacuum is drawn through a vacuum port 501 of the vacuum chuck 500, thereby causing the faceplate structure 301 to conform to the concave configuration of the vacuum chuck 500. While the faceplate structure 301 is held in a concave position, both ends of the spacer wall 200 are affixed to the faceplate structure 301 using an adhesive. After the spacer wall 200 has been attached, the faceplate structure 301 is released, causing the faceplate structure 301 to flatten. This flattening results in a tension stress being developed in the spacer wall 200. The strain introduced in the spacer wall 200 is related to the distance the spacer wall 200 is extended. The extension of the spacer wall, $D_{WALL}$, is defined as: $D_{WALL}=(S-W_L)$, where S is equal to the distance between the points where the spacer wall 200 is affixed to the faceplate structure 301 along the curved surface of the faceplate structure 301, and $W_L$ is equal to the initial un-stretched length of the spacer wall 200 along the X-axis (See, FIG. 14).

The shear load $\tau$ on the adhesive holding the spacer feet in the previously described embodiments is equal to the load on the wall, L, divided by the area of the spacer feet A. The wall load L is equal to the wall stress times the cross sectional area of the spacer wall 200. Thus, for a $8.3\times10^{7}$ Pa stress on a spacer wall 200 having a height of 1.3 mm and a thickness of 60 μm, the wall load L is 6.45 N. If the spacer feet have an area of 2.5 mm by 1 mm, the shear load T on the adhesive holding the spacer feet is $2.6 \times 10^6$ Pa. A shear load of $2.6 \times 10^6$ Pa is less than half the shear strength of the adhesive.

As previously discussed, introducing tension stress into the spacer wall 200 tends to straighten the spacer wall 200. This is important because spacer wall 200 typically includes some inherent waviness. This waviness, if left unchecked, can cause the spacer wall 200 to extend over pixels of the faceplate structure, thereby degrading performance of the resulting flat panel display. By tensioning the spacer walls 200, the waviness in these walls can be eliminated, thereby advantageously achieving invisibility of relatively long spacer walls 200 in a flat panel display.

Although the spacer walls 200 have been described as being connected to the faceplate structure 301, in other embodiments, the spacer walls 200 could be connected to a backplate structure in a similar manner. Such backplate structures, which typically include an insulating backplate and an electron emitting structure, are described in more detail in commonly owned, co-pending U.S. patent application Ser. Nos. 08/081,913, 08/343,074 and 08/684,270, now respectively U.S. Pat. Nos. 5,686,790, 5,650,690, and 5,859,502, which are hereby incorporated by reference in their entirety.

Figure 1:
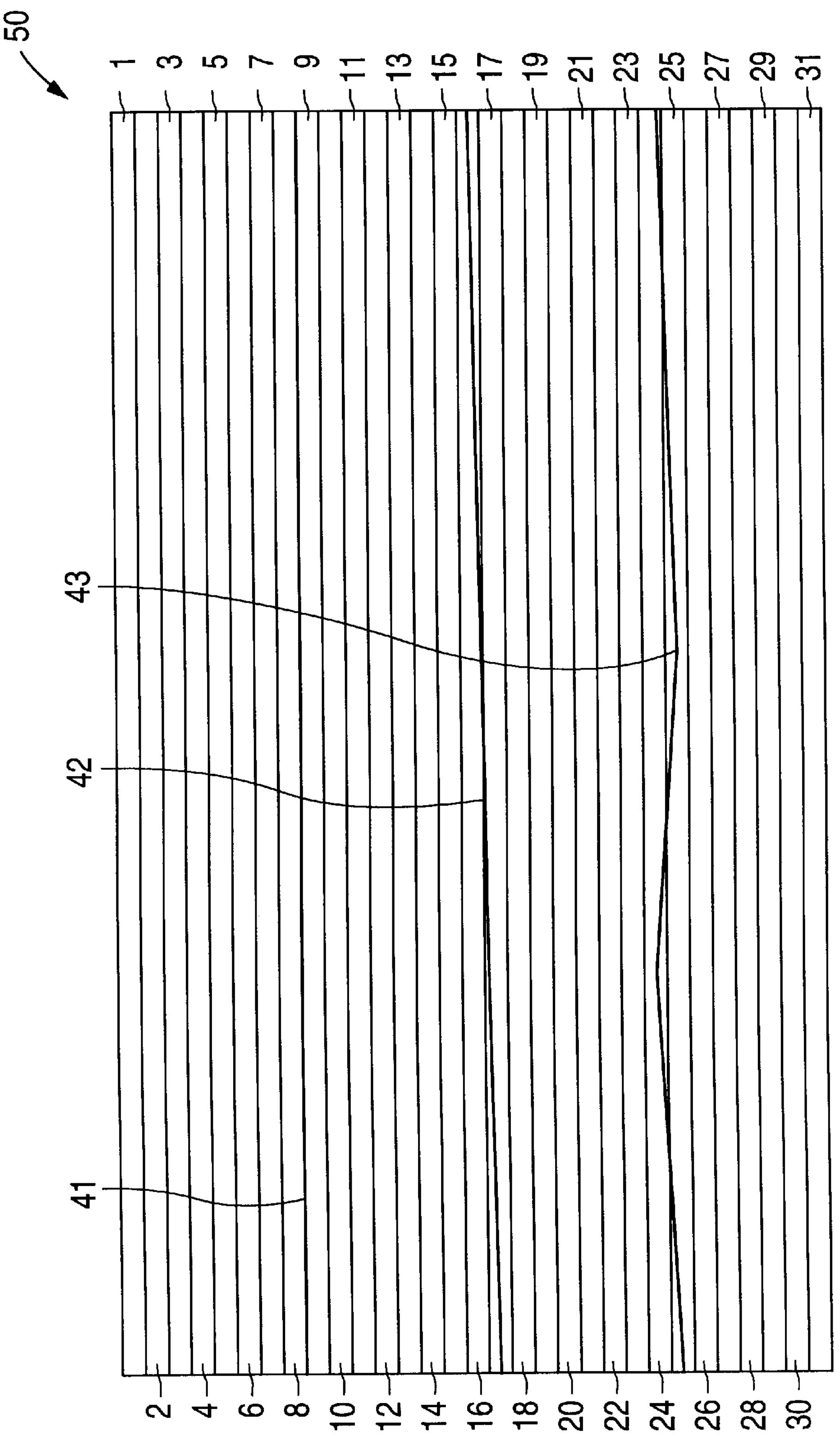
Fig. 1 (PRIOR ART)
FIG. 1 is a schematic representation of the viewing surface of a conventional flat panel display.
Figure 15:
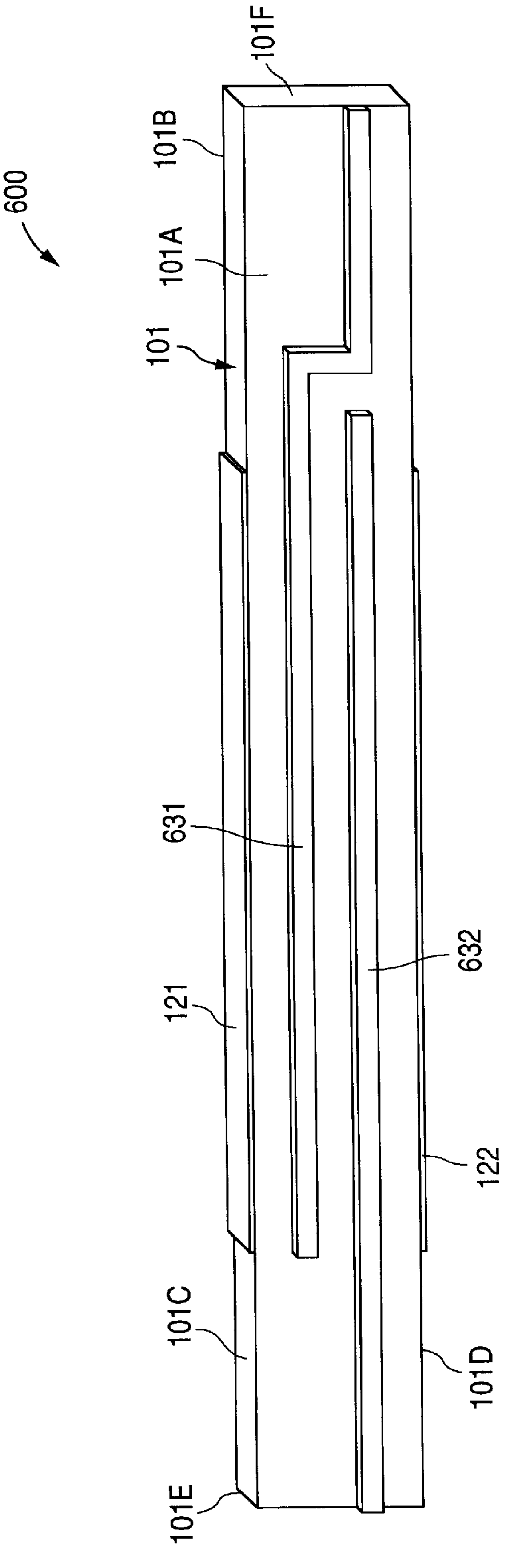
FIG. 15 is an isometric view of a spacer wall in accordance with another embodiment of the present invention.
Figure 16A:
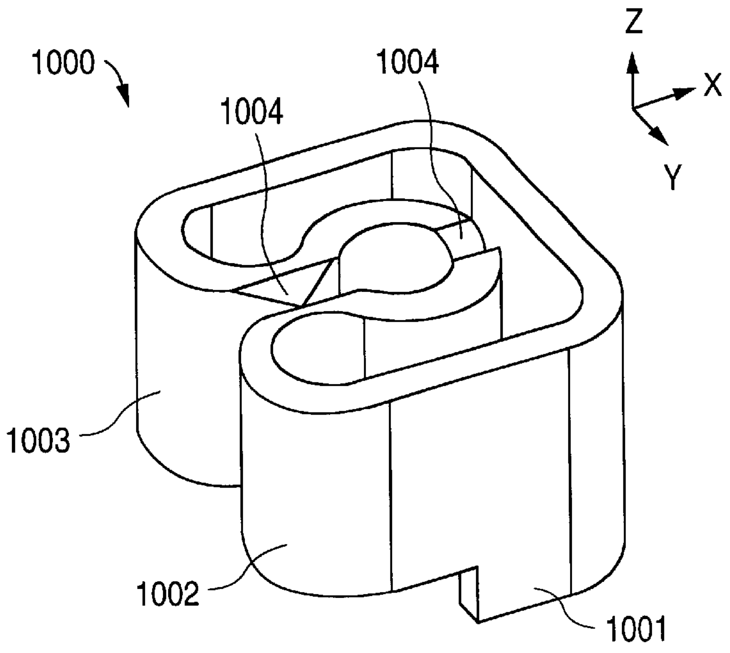
FIGS. 16A, 16B, 16C and 16D are isometric, top, front and side views, respectively, of a spacer clip in accordance with one embodiment of the invention.
Figure 16B:
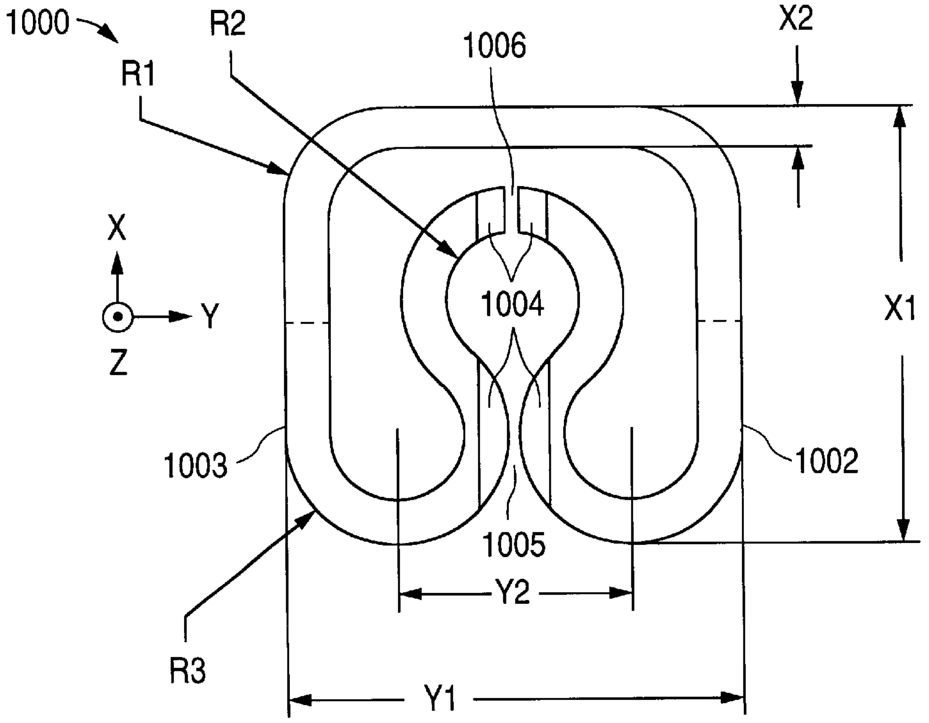
Figure 16C:
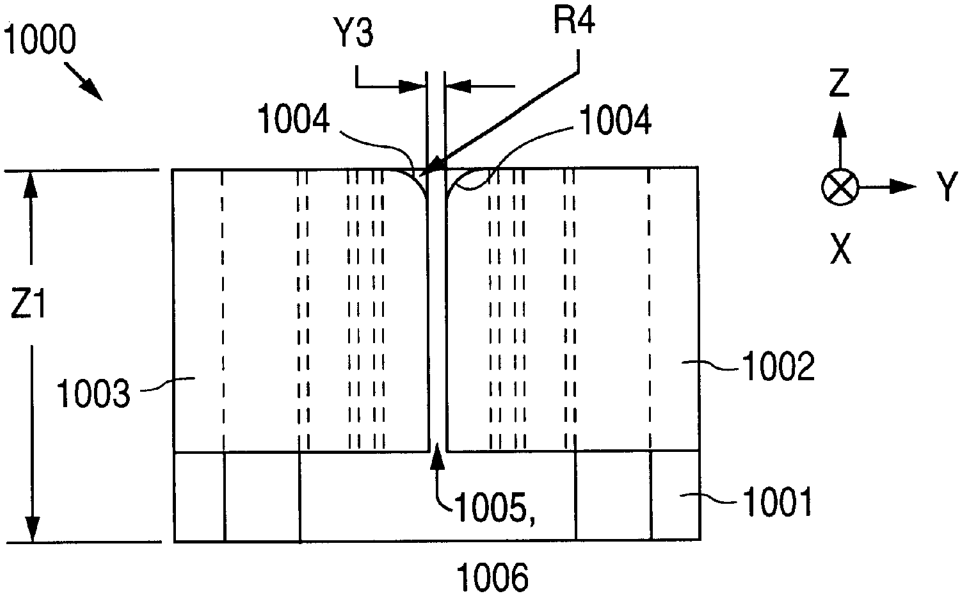
Figure 16D:
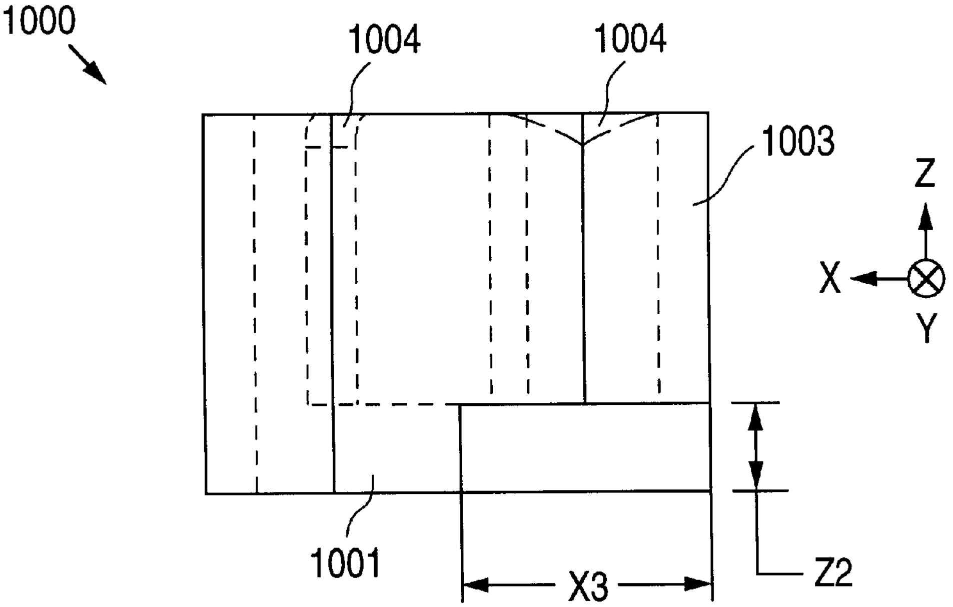

FIG. 15 is an isometric view of a spacer wall 600 in accordance with another embodiment of the present invention. Because spacer wall 600 is similar to spacer wall 100 (FIG. 1), similar elements in FIGS. 1 and 6 are labeled with similar reference numbers. Thus, spacer wall 600 includes spacer body 101, first edge electrode 121 and second edge electrode 122 as previously described in connection with spacer wall 100. Spacer wall 600 additional includes a first face electrode 631 and a second face electrode 632 located on the first face surface 101A of the spacer body 101. The first face electrode 631 extends to the second end 101F of the spacer body 101. Similarly, the second face electrode 632 extends to the first end 101E of the spacer body 101. Although first face electrode 631 juts downward near the second end 101F of the spacer body 101, this is not necessary. That is, the first face electrode 631 could extend straight across the first face surface 101A of the spacer body 101.

Mechanical spacer clips are provided for attachment to the first and second ends 101E and 101F of the spacer wall 600. These spacer clips are electrically conductive, thereby providing electrical connections to the first and second face electrodes 631 and 632. These spacer clips also act to support the spacer wall 600 in a free-standing configuration, such that the spacer wall 600 is held in a perpendicular position with respect to corresponding faceplate and backplate structures. In particular embodiments, these spacer clips introduce tension stress into the spacer wall 600, thereby straightening any inherent waviness in the spacer body 101. Several spacer clips in accordance with the present invention will now be described.

FIGS. 16A, 16B, 16C and 16D are isometric, top, front and side views, respectively, of a spacer clip 1000 in accordance with one embodiment of the invention. Spacer clip 1000 is made of an electrically conductive material, such as phosphor/bronze or another metal. Spacer clip 1000 includes a base 1001, a first spring element 1002 and a second spring element 1003. The first and second spring elements 1002 and 1003 each have a serpentine shape. Spring elements 1002 and 1003 approach one another at two points to form two channel regions 1005 and 1006. Spring elements 1002 and 1003 include beveled surfaces 1004 leading into channels 1005 and 1006. Table 1 sets forth dimensions for spacer clip 1000 in accordance with one embodiment of the invention. Spacer clip 1000 can have other dimensions in other embodiments.

TABLE 1

| | |
|---|---|
| X1 = 1.016 mm | Z1 = 0.76 mm |
| X2 = 0.102 mm | Z2 = 0.178 mm |
| X3 = 0.508 mm | R1 = 0.254 mm |
| Y1 = 1.05 mm | R2 = 0.15 mm |
| Y2 = 0.541 mm | R3 = 0.254 mm |
| Y3 = 0.033 mm | R4 = 0.064 mm |

Figure 17A:
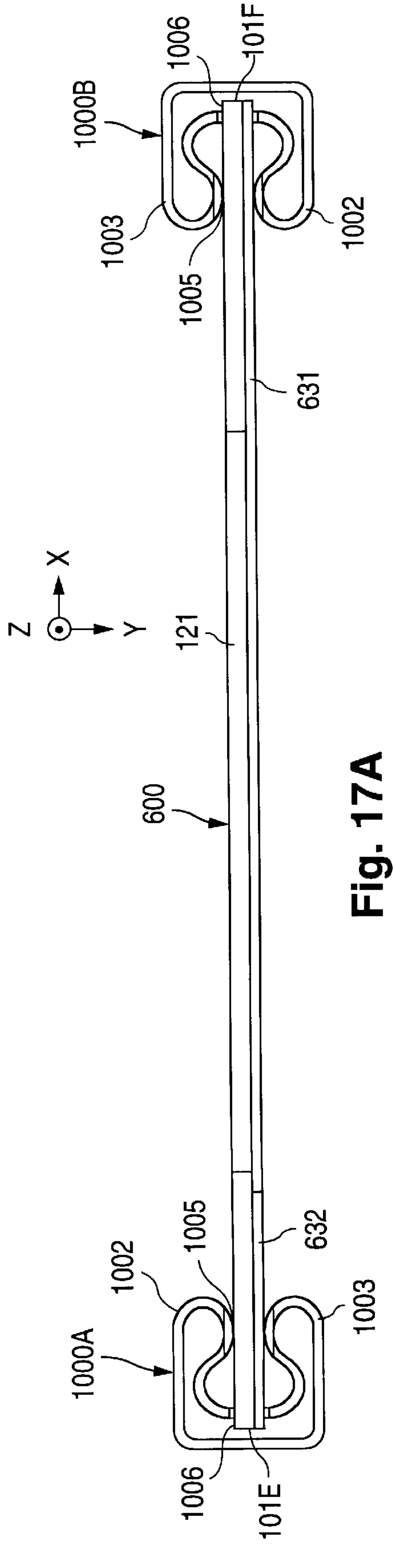
FIGS. 17A and 17B are top and side views, respectively, of spacer clips in accordance with FIGS. 16A–16D attached to the first and second ends of a spacer wall.
Figure 17B:
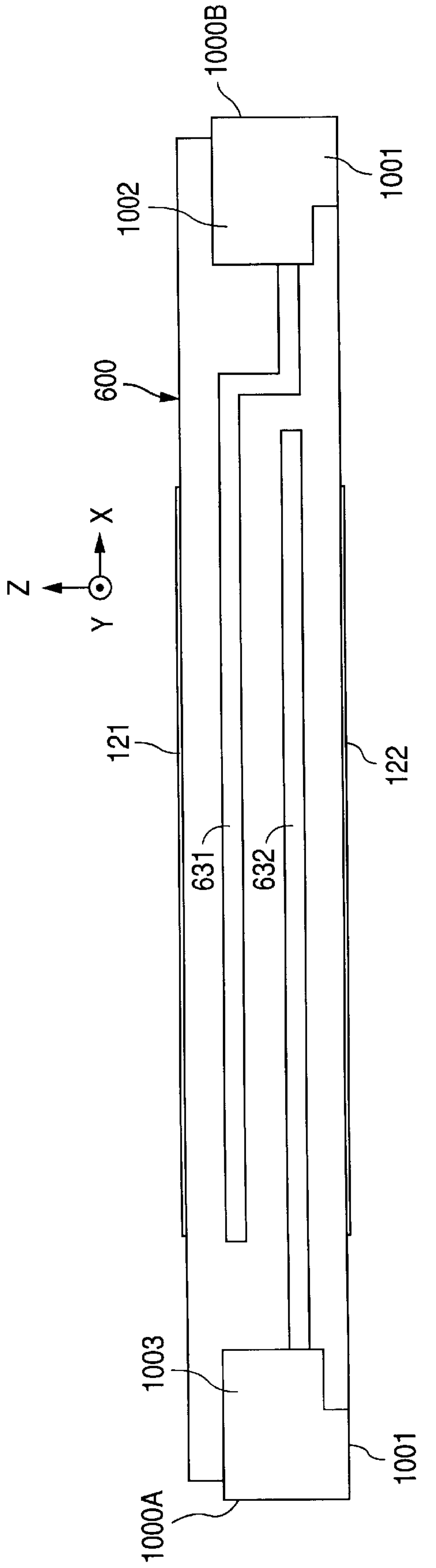

FIGS. 17A and 17B illustrate top and side views, respectively, of spacer clips 1000A and 1000B attached to the first and second ends 101E and 101F of the spacer wall 600. Spacer clips 1000A and 1000B are identical to previously described spacer clip 1000. The first end 101E and the second end 101F of the spacer wall 600 are slid down into the channels 1005 and 1006 of spacer clips 1000A and 1000B, respectively.

The beveled surfaces (1004) of the spacer clips 1000A and 1000B facilitate the insertion of the spacer wall 600 into channels 1005 and 1006. Channels 1005 and 1006 hold the spacer wall 600 in a perpendicular position with respect to the faceplate structure. Locating the spacer wall 600 within two channels 1005 and 1006 in each spacer clip prevents the spacer clip from rotating about the Z-axis in response to forces which may be applied by the spacer wall 600.

As illustrated in FIGS. 17A and 17B, spacer clip 1000A makes physical and electrical contact with the second face electrode 632 within each of channels 1005 and 1006 of spacer clip 1000A. Similarly, spacer clip 1000B makes physical and electrical contact with the first face electrode 631 within each of channels 1005 and 1006 of spacer clip 1000B.

In one embodiment, the spacer clips 1000A and 1000B are not secured to the spacer wall 600 within channels 1005 and 1006. Instead, the spacer wall 600 is able to move along the X-axis within channels 1005 and 1006. In this embodiment, the spacer wall 600 is free to expand and contract along the X-axis, without substantially affecting the alignment of the spacer wall 600.

Figure 17C:
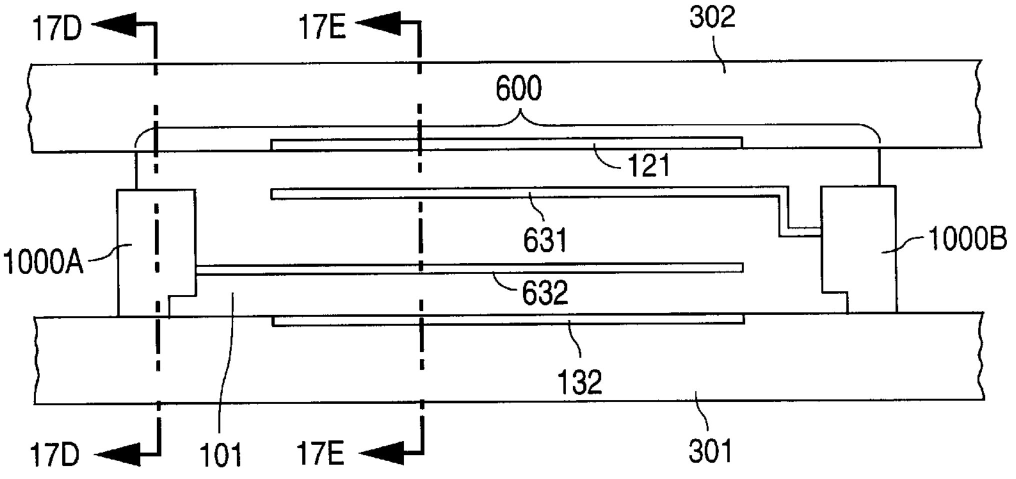
FIG. 17C is a front cross sectional view of a portion of a flat panel display in which multiple spacer walls having spacer clips configured as shown in FIGS. 16A–16D are situated between a faceplate structure and a backplate structure of the display.
Figure 17D:
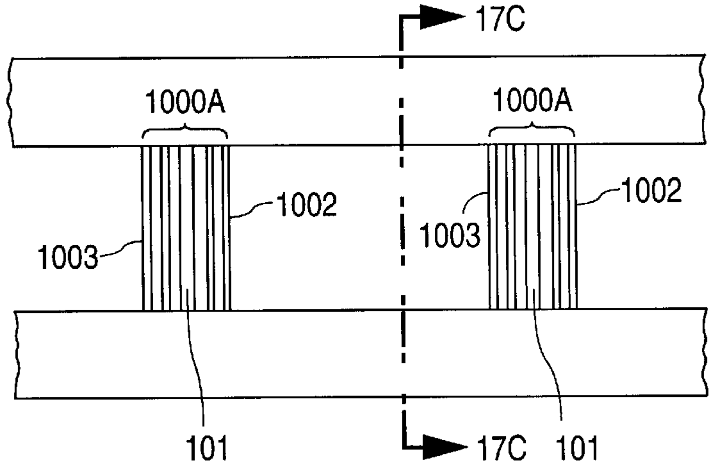
FIGS. 17D and 17E are side cross sectional views of the portion of the flat panel display of FIG. 17C taken respectively along section lines 17D—17D and 17E—17E in FIG. 17C; the front cross section of FIG. 17C is taken along section line 17C—17C in FIGS. 17D and 17E.
Figure 17E:
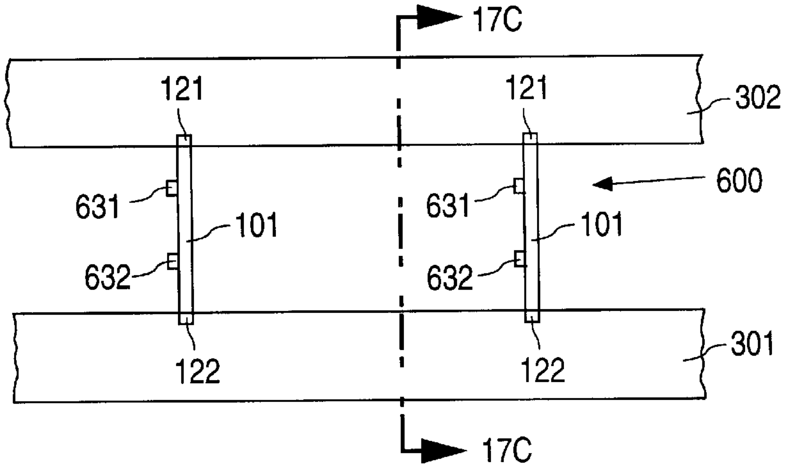
Figure 18A:
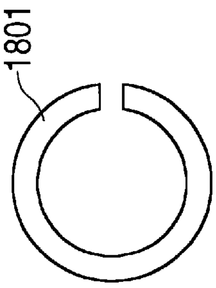
FIGS. 18A, 18B, 18C, 18D and 18E are top schematic views of electrically conductive spacer clips having various shapes in accordance with other embodiments of the invention.
Figure 18B:
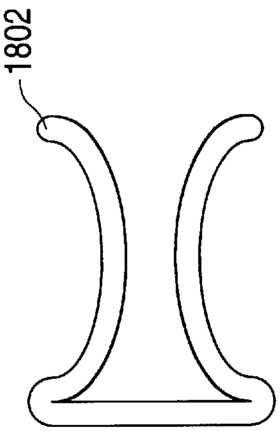
Figure 18C:
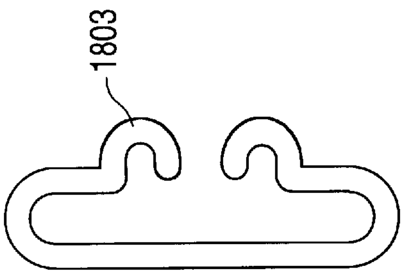
Figure 18D:
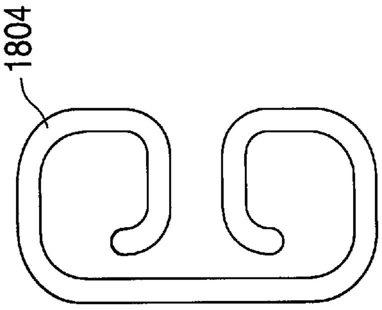
Figure 18E:
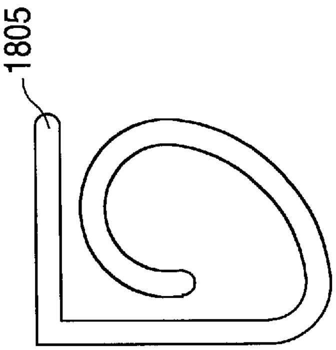

FIG. 17C presents a front cross section of a portion of a flat panel display configured according to the invention. The flat panel display of FIG. 17C is formed with faceplate structure 301, backplate structure 302, and a group of spacer walls 600 provided with spacer clips 1000A and 1000B. Each spacer wall 600 is situated between faceplate structure 301 and backplate structure 302 so that spacer clips 1000A and 1000B of each spacer wall 600 contact faceplate structure 301. FIGS. 17D and 17E present side cross sections of the portion of the flat panel display shown in FIG. 17C. FIGS. 17D and 17E are taken respectively along section lines 17D—17D and 17E—17E of FIG. 17C. FIG. 17C is taken along section line 17C—17C of FIGS. 17D and 17E.

The spacer wall 600 and the spacer clips 1000A and 1000B are secured to a faceplate structure in substantially the same manner previously described in connection with FIGS. 9–13. More specifically, the spacer wall 600 (with spacer clips 1000A and 1000B attached) is inserted in a matrix gap, such as matrix gap 341 (FIG. 12). Electrodes 351–352 and 354–355 can be used to electrostatically tack the spacer clips 1000A and 1000B in the manner previously described. The faceplate structure 301 must be slightly modified such that a conductive bump extends from one of electrodes 351 or 352 to the spacer clip 1000A, and such that a conductive bump extends from one of electrodes 354 or 355 to the spacer clip 1000B. In the described example, it is assumed that spacer clip 1000A is connected to electrode 351 and that spacer clip 1000B is connected to electrode 355. The conductive bumps can be gold bumps which bond the spacer clips 1000A and 1000B to their corresponding electrodes 351 and 355 through the application of heat, pressure and/or ultrasonic energy. If the gold bumps are insufficient to hold the spacer clips 1000A and 1000B to the faceplate structure 301, an adhesive can be applied between the spacer clips 1000A and 1000B and the faceplate structure 301.

Note that only the base portions 1001 of spacer clips 1000A and 1000B are fixed to the faceplate structure 301. This ensures that the first and second spring elements 1002 and 1003 of the spacer clips are free floating, and thereby exhibit resilient characteristics which enable the spacer clips to grip the spacer wall 600. Also note that spacer clips 1000A and 1000B must be separated from the light emitting structure 322 of the faceplate structure 301 (as well as the electron emitting structure of the backplate structure) to avoid arcing.

The resulting structure results in the first face electrode 631 being electrically connected to electrode 355 through electrically conductive spacer clip 1000B and the corresponding conductive bump. Similarly, the second face electrode 632 is electrically connected to the electrode 351 through electrically conductive spacer clip 1000A and the corresponding conductive bump. (Note that electrode 353 is not required in this embodiment, since electrode 351 provides the connection to the second face electrode 632.)

In another embodiment, spacer clip 1000A and/or spacer clip 1000B are secured to the spacer wall 600 within either channel 1005 or channel 1006. For example, an adhesive can be located in channels 1006 of spacer clips 1000A and 1000B, such that the spacer clips 1000A and 1000B are affixed to the spacer wall 600 within channel 1006 (i.e., at the ends of spring elements 1002 and 1003). Alternatively, a solder bond can be formed between the face electrodes 631 and 632 and the corresponding spacer clips within the channels 1006 of spacer clips 1000A and 1000B. At this point, the spacer wall 600 and spacer clips 1000A and 1000B can be heated above room temperature and affixed to the faceplate structure 301, which is maintained at room temperature. As the spacer wall 600 cools, the spacer wall 600 will contract, thereby placing the spring elements 1002 and 1003 of spacer clips 1000A and 1000B into tension. This tension will tend to straighten the spacer wall 600, thereby removing any inherent waviness in the wall. Tension can alternatively be introduced into the spring elements 1002 and 1003 prior to attachment to the faceplate structure 301 by an expanding fixture, such as mechanical screws, piezoelectric devices, or a high thermoexpansion alloy. Tension can also be introduced into the spring elements 1002 and 1003 by bending the faceplate structure 301 into a concave configuration prior to attachment of the spacer clips 1000A and 1000B. (See, e.g., FIG. 14.)

In other embodiments, conductive spacer clips having other shapes can be used. For example, FIGS. 18A, 18B, 18C, 18D and 18E are top schematic views of electrically conductive spacer clips 1801, 1802, 1803, 1804 and 1805, respectively, having various shapes in accordance with other embodiments of the invention. The shapes of spacer clips 1801–1805 are intended to be illustrative and not limiting. Spacer clips 1801–1805 can be used in the same manner previously described in connection with spacer clip 1000.

Figure 19C:
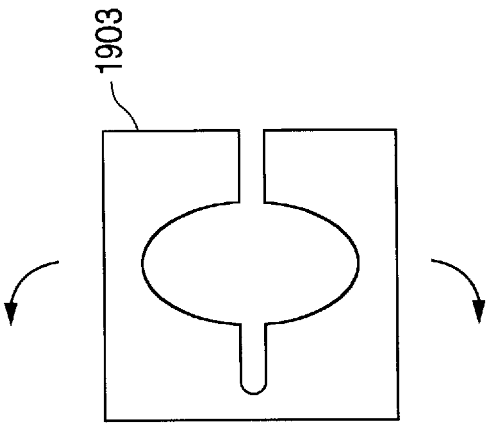
FIGS. 19A, 19B and 19C are top schematic views of ceramic spacer clips having various shapes in accordance with other embodiments of the invention.
Figure 19B:
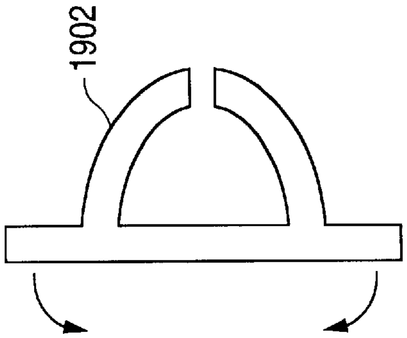
Figure 19A:
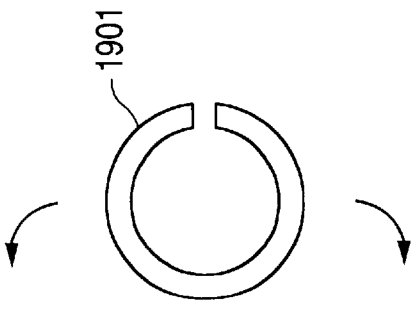

In yet another embodiment, spacer clips made from a dielectric material, such as ceramic, glass, silicon or thermoplastic, can be used. These dielectric spacer clips are fitted over the ends of a corresponding spacer wall, but do not provide an electrically conductive path from the face electrodes of the spacer wall to the faceplate structure. Instead, this electrically conductive path would be provided in the same manner previously described for spacer wall 200 (See, e.g., FIG. 13). The material used to form the dielectric spacer clips can be selected such that the CTE of the dielectric spacer clips matches the CTE of the corresponding spacer wall. FIGS. 19A, 19B and 19C are top schematic views of dielectric spacer clips 1901, 1902 and 1903, respectively, having various shapes in accordance with other embodiments of the invention. The dielectric spacer clips 1901–1903 can be formed by a conventional extrusion process. The slots in the spacer clips 1901–1903 can be formed by a conventional cutting tool. Spacer walls can be affixed or free-floating within the slots of the dielectric spacer clips 1901–1903. The arrows in FIGS. 19A–19C indicate the directions of forces which can be applied to the dielectric spacer clips 1901–1903, thereby further opening the slots in these spacer clips to receive a spacer wall. The shapes of spacer clips 1901–1903 are intended to be illustrative and not limiting.

Figure 20:
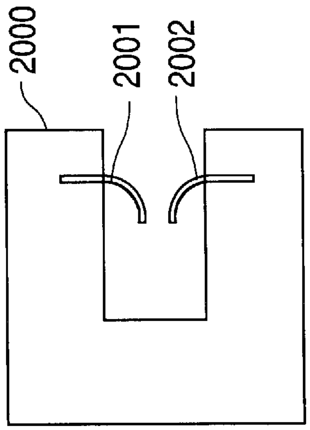
FIG. 20 is a top schematic view of a hybrid metal/ceramic spacer clip which includes a ceramic frame and metal springs.

FIG. 20 is a top schematic view of a hybrid metal/ceramic spacer clip 2000, which includes dielectric frame 2001 and metal springs 2002 and 2003. Hybrid spacer clip 2000 holds an end of a spacer wall, and is attached to a faceplate structure in the manner previously described.

Figure 21:
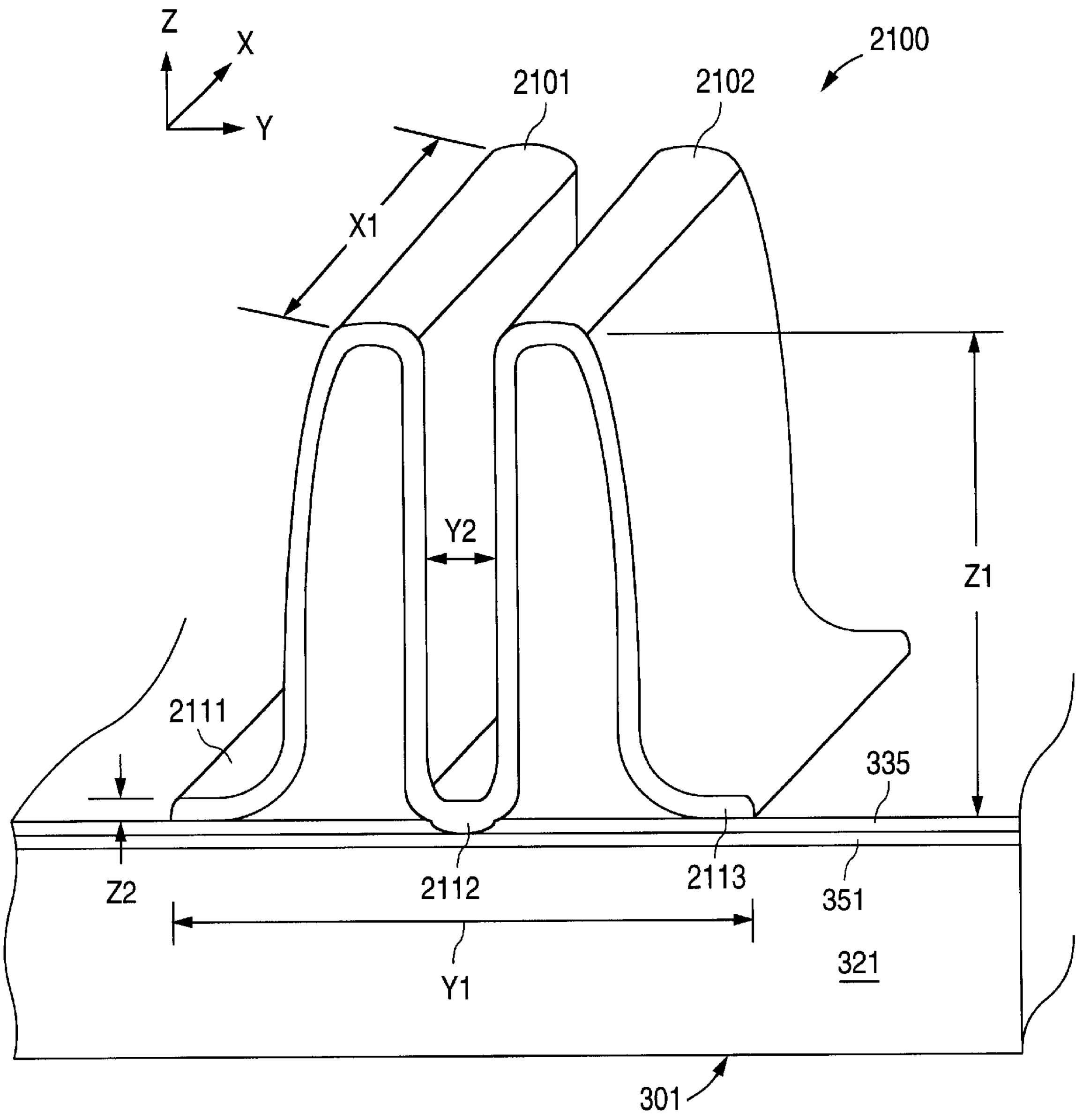
FIG. 21 is an isometric view of a spacer clip in accordance with yet another embodiment of the invention.

In yet another embodiment of the present invention, an electrically conductive spacer clip is fabricated on the faceplate structure to provide support for a spacer wall and an electrical connection to a face electrode on the spacer wall. FIG. 21 is an isometric view of a spacer clip 2100 in accordance with this embodiment of the invention. Spacer clip 2100 is fabricated on faceplate structure 301 using a commercially available ultrasonic ribbon wire wedge bonder. In the described embodiment, spacer clip 2100 is made from aluminum ribbon wire and has dimensions as set forth in Table 2. In other embodiments, spacer clip 2100 can have other dimensions.

TABLE 2

| |
|---|
| X1 = 0.51 mm |
| Y1 = 0.51 mm |
| Y2 = 0.05 mm |
| Z1 = 0.51 mm |
| Z2 = 0.05 mm |

Height Z1 is controlled to make two large loops 2101 and 2102 by forming three bonds 2111, 2112 and 2113 in succession. The first two bonds 2111 and 2112 are made without engaging the rock/nicking tool for cutting the ribbon wire. The center width Y2 is controlled by the size of the bond flat (or foot) used by the ribbon bonder. Center width Y2 can be as small as 0.05 mm on a wirebond tool head. Alternatively, bonds 2111 and 2113 can be made initially, and a second deep reach wedge bonding head can be used to make the middle bond 2112. A separate forming tool may be used to form the wire ribbon into a configuration which will better grip a spacer wall.

One of the bonds 2111–2113 (e.g., bond 2112) is connected to an electrode 351 in the faceplate structure 301, through a polyimide layer 335. When the spacer wall is inserted between the two loops 2101 and 2102, one of these loops contacts a face electrode on the spacer wall, thereby electrically connecting the face electrode to the electrode 351 in the faceplate structure 301. The spacer clip 2100 further provides support to the spacer wall. Additional spacer clips, similar to spacer clip 2100, can be added if additional support is needed. The spacer wall permits small linear shifts in the position of the spacer wall along the X-axis relative to the faceplate structure due to any mismatch in thermal expansion.

High rigidity can be added to the spacer clip 2100 by using a precipitation hardened alloy ribbon. For example, 5% copper can be added to aluminum with a 540° C. solution treatment and quench to provide a sufficiently soft alloy suitable for wirebonding. Aging this alloy at 400° C. for an hour dramatically increases the hardness (rigidity) and strength, thereby imparting a spring-like behavior to the alloy. Alternatively, 2% beryllium can be added to copper with an 800° C. solution treatment and quench to provide a sufficiently soft alloy suitable for wirebonding. Aging this alloy at 320° C. for an hour increases the hardness of the alloy and rigidity of the spacer clip 2100.

Spacer clip 2100 provides a simple and economical structure for providing support for spacer walls, since existing ribbon wirebonding technology is implemented to fabricate spacer clip 2100.

Figure 22:
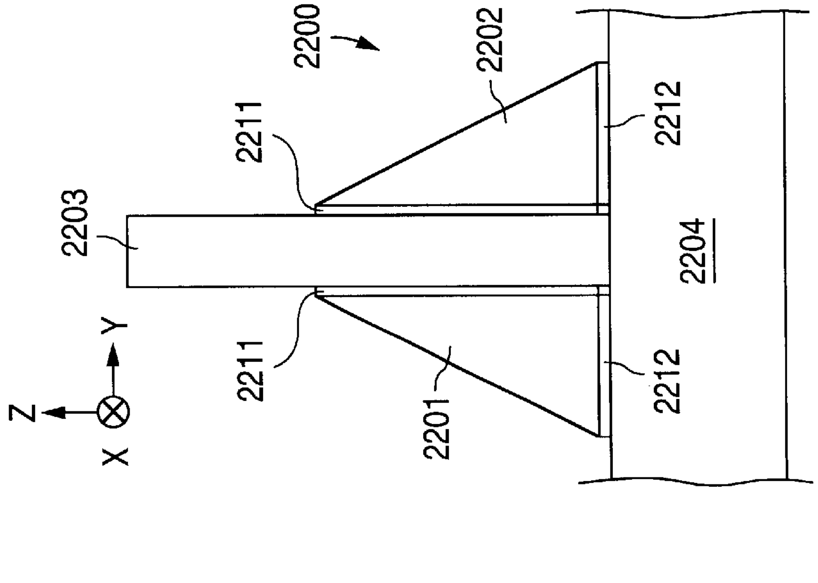
FIG. 22 is an end view of a spacer support structure in accordance with another embodiment of the invention.

FIG. 22 is an end view of another spacer support structure 2200 in accordance with another embodiment of the invention. Spacer support 2200 includes a pair of spacer feet 2201 and 2202 which are initially adhered to a spacer wall 2203 using a temporary adhesive 2211. The spacer feet 2201 and 2202 are subsequently affixed to a faceplate structure 2204 using a permanent adhesive 2212. The temporary adhesive is then made non-adhesive. As a result, the spacer wall 2203 is held between spacer feet 2201 and 2202, but has a degree of free motion along the X-axis to allow for thermal expansion and contraction of the spacer wall 2203.

Figure 23B:
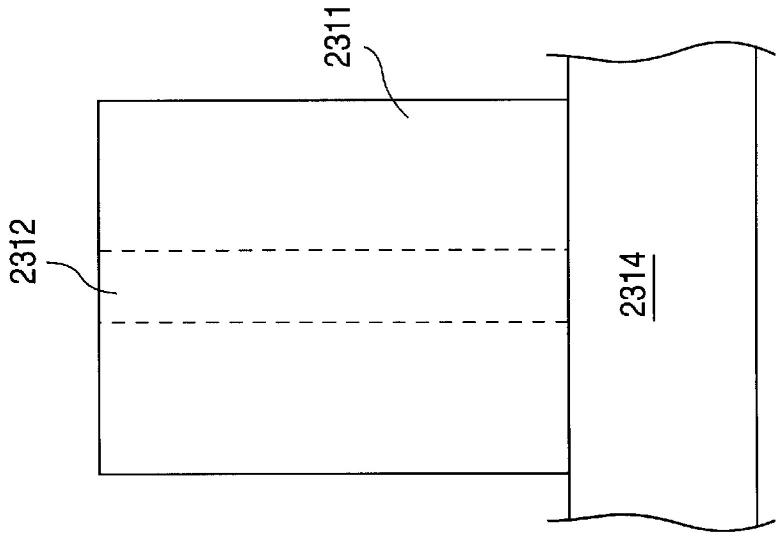
FIGS. 23A and 23B are end views of spacer feet in accordance with yet another embodiment of the invention.
Figure 23A:
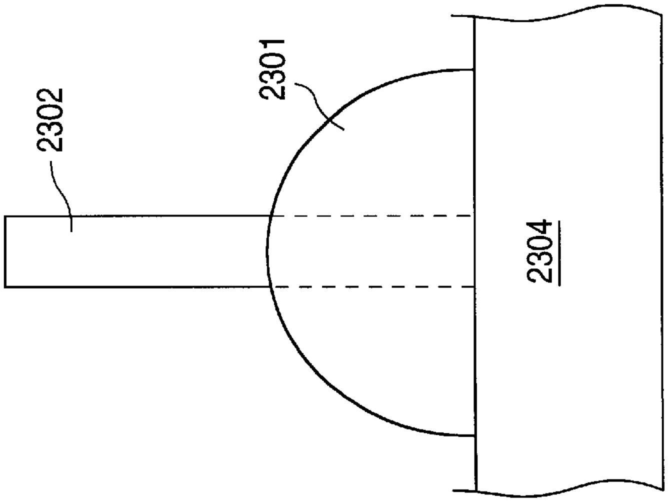

FIGS. 23A and 23B are end views of spacer feet 2301 and 2311 in accordance with yet another embodiment of the invention. Spacer feet 2301 and 2311 are affixed to the ends of spacer walls 2302 and 2312, respectively. Spacer foot 2301 extends partially up the spacer wall 2302, while spacer foot 2311 extends the full height of spacer wall 2312. Spacer feet 2301 and 2311 are attached to faceplate structures 2304 and 2314, respectively, and operate in the same manner previously described for spacer feet 111–114 (FIGS. 2, 3) to support spacer walls 2302 and 2312, respectively.

Although the invention has been described in connection with several embodiments, it is understood that this invention is not limited to the embodiments disclosed, but is capable of various modifications which would be apparent to one of ordinary skill in the art. For example, in each of the described embodiments, the spacer feet or spacer clips can be affixed to a backplate structure, rather than the faceplate structure, of a flat panel display. Thus, the invention is limited only by the following claims.

What is claimed is:

1. A spacer (a) for location between a faceplate structure and a backplate structure of a flat panel display and (b) for resisting external forces exerted on the flat panel display, the spacer comprising:

a spacer wall having (a) a first edge surface for being located adjacent the faceplate structure, (b) a second edge surface, opposite the first edge surface, for being located adjacent the backplate structure, (c) a first face surface extending between the edge surfaces, (d) a second face surface opposite the first face surface and extending between the edge surfaces, (e) a first end, and (f) a second end distal from the first end;

a first spacer foot located over the first face surface largely at the first end of the spacer wall, wherein the first spacer foot has a pair of opposite support surfaces respectively largely co-planar with the edge surfaces;

a second spacer foot located over the first face surface largely at the second end of the spacer wall, wherein the second spacer foot has a pair of opposite support surfaces respectively largely co-planar with the edge surfaces;

a first edge electrode located over the first edge surface; and a second edge electrode located over the second edge surface.

2. The spacer of claim 1, further comprising:

a third spacer foot located over the second face surface largely at the first end of said spacer wall, wherein the third spacer foot has a pair of opposite support surfaces respectively largely co-planar with the edge surfaces; and a fourth spacer foot located over the second face surface largely at the second end of the spacer wall, wherein the fourth spacer foot has a pair of opposite support surfaces.

3. The spacer of claim 1, wherein the support surfaces of the first and second spacer feet are largely perpendicular to the first and second face surfaces of the spacer wall.

4. The spacer of claim 1, wherein:

the first edge electrode is for contacting the faceplate structure; and the second edge electrode is for contacting the backplate structure.

5. The spacer of claim 4, wherein the edge electrodes are electrically separate from each other.

6. The spacer of claim 5, further comprising one or more face electrodes, each located over part of one of the face surfaces.

7. The spacer of claim 1, further comprising one or more face electrodes located over the first face surface.

8. The spacer of claim 1, further comprising one or more face electrodes located over the second face surface.

9. The spacer of claim 1, wherein the spacer wall comprises ceramic.

10. The spacer of claim 1, wherein the first and second spacer feet comprise ceramic.

11. The spacer of claim 1, wherein the first and second spacer feet comprise glass frit.

12. The spacer of claim 1, wherein the first and second spacer feet comprise glass.

13. The spacer of claim 1, wherein the first and second spacer feet comprise glass and ceramic.

14. A spacer structure (a) for location between a faceplate structure and a backplate structure of a flat panel display and (b) for resisting external forces exerted on the flat panel display, the spacer structure comprising:

a spacer wall having (a) a first edge surface for being located adjacent the faceplate structure, (b) a second edge surface, opposite the first edge surface, for being located adjacent the backplate structure, (c) a first face surface extending between the edge surfaces, (d) a second face surface situated opposite the first face surface and extending between the edge surfaces, (e) a first end, and (f) a second end distal from the first end;

a first spacer clip which clamps the face surfaces largely at the first end of the spacer wall;

a second spacer clip which clamps the face surfaces largely at the second end of the spacer wall; and a first face electrode located over the first face surface of the spacer wall, wherein the firs spacer clip contacts the first face electrode.

15. The spacer structure of claim 14, wherein the first spacer clip is electrically conductive for electrical connection an electrode of the flat panel display so as to provide electrical connection between the first face electrode and the electrode of the flat panel display.

16. The spacer structure of claim 14, further comprising a second face electrode located over the first face surface of the spacer wall, wherein the second spacer clip contacts the second face electrode.

17. The spacer structure of claim 14, wherein the first and second spacer clips are affixed to the spacer wall.

18. The spacer structure of claim 14, wherein each spacer clip has an edge surface largely co-planar with the first edge surface of the spacer wall.

19. A spacer structure (a) for location between a faceplate structure and a backplate structure of a flat panel display and (b) for resisting external forces exerted on the flat panel display, the spacer structure comprising:

a spacer wall having (a) a first edge surface for being located adjacent the faceplate structure, (b) a second edge surface, opposite the first edge surface, for being located adjacent the backplate structure, (c) a first face surface extending between the edge surfaces, (d) a second face surface situated opposite the first face surface and extending between the edge surfaces, (e) a first end, and (f) a second end distal from the first end;

a first spacer clip which clamps the face surfaces largely at the first end of the spaces wall; and a second spacer clip which clamps the face surfaces largely at the second end of the spacer wall, the first and second spacer clips being electrically conductive.

20. A spacer structure (a) for location between a faceplate structure and a backplate structure of a flat panel display and (b) for resisting external forcers exerted on the flat panel display, the spacer structure comprising:

a spacer wall having (a) a first edge surface for being located adjacent the faceplate, structure, (b) a second edge surface, opposite the first edge surface, for being located adjacent the backplate structure, (c) a first face surface extending between the edge surfaces, (d) a second face surface situated opposite the first face surface and extending between the edge surfaces, (e) a first end, and (f) a second end distal from the first end;

a first spacer clip which clamps the face surfaces largely at the first end of the spacer wall, the first spacer clip comprising two channels for receiving the spacer wall; and a second spacer clip which clamps the face surfaces largely at the second end of the spacer wall.

21. The spacer structure of claim 20, wherein the first and second spacer clips comprise dielectric material.

22. The spacer structure of claim 21, wherein the dielectric material comprises ceramic, glass, silicon or thermoplastic.

23. A spacer structure (a) for location between a faceplate structure and a backplate structure of a flat panel display and (b) for resisting external forces exerted on the flat panel display, the spacer structure comprising:

a spacer wall having (a) a first edge surface for being located adjacent the faceplate structure, (b) a second edge surface, opposite the first edge surface, for being located adjacent the backplate structure, (c) a first face surface extending between the edge surfaces, (d) a second face surface situated opposite the first face surface and extending between the edge surfaces, (e) a first end, and (f) a second end distal from the first end;

a first spacer clip which clamps the face surfaces largely at the first end of the spacer wall, the first spacer clip comprising a ribbon of electrically conductive material for bonding to a selected one of the faceplate structure and the backplate structure, the ribbon having two adjacent loops which define a channel for receiving the spacer wall; and a second spacer clip which clamps the face surfaces largely at the second end of the spacer wall.

24. A spacer structure (a) for location between a faceplate structure and a backplate structure of a flat panel display and (b) for resisting external forces exerted on the flat panel display, the spacer structure comprising;

a spacer wall having (a) a first edge surface for being located adjacent the faceplate structure, (N) a second edge surface, opposite the first edge surface, for being located adjacent the backplate structure, (c) a first face surface extending between the edge surfaces, (d) a second face surface situated opposite the first face surface and extending between the edge surfaces, (e) a first end, and (f) a second end distal from the first end;

a first spacer clip which clamps the face surfaces largely at the first end of the spacer wall;

a second spacer clip which clamps the face surfaces largely at the second end of the spacer wall;

a first edge electrode located over the first edge surface; and a second edge electrode located over the second edge surface.

25. The spacer structure of claim 24, wherein:

the first edge electrode contacts the faceplate structure; and the second edge electrode contacts the backplate structure.

26. The spacer structure of claim 25, wherein the edge electrodes are electrically separate from each other.

27. The spacer structure of claim 26, further comprising one or more face electrodes, each located over part of one of the face surfaces.

28. A spacer situated between a faceplate structure and a backplate structure of a flat panel display so as to resist external forces exerted on the flat panel display, the spacer comprising:

a spacer wall having (a) a first edge surface adjacent a selected one of the faceplate and backplate structures, (b) a second edge surface opposite the first edge surface and adjacent the remaining one of the faceplate and backplate structures, (c) a first face surface extending between the edge surfaces, (d) a second face surface opposite the first face surface and extending between the edge surfaces, (e) a first end, and (f) a second end distal from the first end;

a first spacer foot located over the first face surface near the first end of the spacer wall and having a support surface largely co-planar with the first edge surface;

a second spacer foot located over the first face surface near the second end of the spacer wall and having a support surface largely co-planar with the first edge surface, the first and second spacer feet substantially fully separated from each other by open space; and an edge electrode located over one of the edge surfaces.

29. The spacer of claim 28, further comprising a third spacer foot located over the second face surface near the first end of the spacer wall and having a support surface largely co-planar with the first edge surface.

30. The spacer of claim 29, further comprising a fourth spacer foot located over the second face surface near the second end of the spacer wall and having a support surface largely co-planar with the first edge surface.

31. The spacer of claim 28, further comprising one or more face electrodes located over the first face surface, the first and second spacer feet extending much further away from the first face surface than each face electrode.

32. The spacer of claim 28, further comprising one or more face electrodes located over the second face surface.

33. The spacer of claim 28, wherein the selected structure is the faceplate structure.

34. The spacer of claim 28, wherein:

the edge electrode constitutes a first edge electrode located over the first edge surface; and the spacer further comprises a second edge electrode located over the second edge surface.

35. The spacer of claim 34, wherein:

the first edge electrode contacts the faceplate structure; and the second edge electrode contacts the backplate structure.

36. The spacer of claim 35, wherein the edge electrodes are electrically separate from each other.

37. The spacer of claim 36, further comprising one or more face electrodes, each located over part of one of the face surfaces, the first and second spacer feet extending much further away from the first face surface than any such face electrode located over part of the first face surface.

38. The spacer of claim 28, wherein the spacer feet comprise ceramic.

39. The spacer of claim 28, wherein the spacer feet comprise glass frit.

40. The spacer of claim 28, wherein the spacer feet comprise glass.

41. The spacer of claim 28, wherein the spacer feet comprise glass and ceramic.

42. The spacer of claim 28, further comprising one or more face electrodes, each located over part of one of the face surfaces, the first and second spacer feet extending much further away from the first face surface than any such face electrode located over part of the first face surface.

43. A spacer structure situated between a faceplate structure and a backplate structure of a flat panel display so as to resist external forces exerted on the flat panel display, the spacer structure comprising:

a spacer wall having (a) a first edge surface adjacent a selected one of the faceplate and backplate structures, (b) a second edge surface opposite the first edge surface and adjacent the remaining one of the faceplate and backplate structures, (c) a first face surface extending between the edge surfaces, (d) a second face surface opposite the first face surface and extending between the edge surfaces, (e) a first end, and (f) a second end distal from the first end; and a first spacer clip which clamps the face surfaces largely at the first end of the spacer wall.

44. The spacer structure of claim 43, further comprising a first face electrode located over the first face surface of the spacer wall and contacting the first spacer clip.

45. The spacer structure of claim 44, wherein the first spacer clip is electrically conductive, the first spacer clip being electrically connected to an electrode of the flat panel display such that the first spacer clip provides an electrical connection between the first face electrode and the electrode of the flat panel display.

46. The spacer structure of claim 43, wherein the selected structure is the faceplate structure.

47. The spacer structure of claim 43, further comprising:

a first edge electrode located over the first edge surface; and a second edge electrode located over the second edge surface.

48. The spacer structure of claim 47, wherein:

the first edge electrode contacts the faceplate structure; and the second edge electrode contacts the backplate structure.

49. The spacer structure of claim 48, wherein the edge electrodes are electrically separate from each other.

50. The spacer structure of claim 49, further comprising one or more face electrodes, each located over part of one of the face surfaces.

51. The spacer structure of claim 43, further comprising a second spacer clip which clamps the face surfaces largely at the second end of the spacer wall.

52. The spacer structure of claim 51, further comprising a second face electrode located over a prescribed one of the face surfaces of the spacer wall and contacting the second spacer clip.

53. The spacer structure of claim 52, wherein the prescribed face surface is the first face surface.

54. The spacer structure of claim 51, wherein each spacer clip has an edge surface largely co-planar with a prescribed one of the edge surfaces of the spacer wall.

55. The spacer structure of claim 54, wherein the selected structure is the faceplate structure, the prescribed edge surface being the first edge surface.

56. The spacer structure of claim 54, further comprising a pair of face electrodes, each located over part of one of the face surfaces and contacting a different one of the spacer clips.

57. The spacer structure of claim 51, further comprising a first face electrode located over the first face surface of the spacer wall and contacting the first spacer clip.

58. The spacer structure of claim 43, further comprising an edge electrode located over one of the edge surfaces.

59. The spacer structure of claim 58, further comprising one or more face electrodes, each located over part of one of the face surfaces.

60. A spacer (a) for location between a faceplate structure and a backplate structure of a flat panel display and (b) for resisting external forces exerted on edge flat panel display, the spacer comprising:

a spacer wall having (a) a first edge surface for being located adjacent the faceplate structure, (b) a second edge surface, opposite the first edge surface, for being located adjacent the backplate structure, (c) a first face surface extending between the edge surfaces, (d) a second face surface opposite the first face surface and extending between the edge surfaces, (e) a first end, and (f) a second end distal from the first end;

a first spacer foot located over the first face surface largely at the first end of the spacer wall, wherein the first spacer foot has a pair of opposite support surfaces respectively largely co-planar with the edge surfaces;

a second spacer foot located over the first face surface largely at the second end of the spacer wall, wherein the second spacer foot has a pair of opposite support surfaces respectively largely co-planar with the edge surfaces; and an edge electrode located over one of the edge surfaces.

61. A spacer structure (a) for location between a faceplate structure and a backplate structure of a flat panel display and (b) for resisting external forces exerted on the flat panel displays the spacer structure comprising:

a spacer wall having (a) a first edge surface for being located adjacent the faceplate structure, (b) a second edge surface, opposite the first edge surface, for being located adjacent the backplate structure, (c) a first face surface extending between the edge surfaces, (d) a second face surface situated opposite the first face surface and extending between the edge surfaces, (e) a first end, and (f) a second end distal from the first end;

a first spacer clip which clamps the face surfaces largely at the first end of the spacer a second spacer clip which clams the face surfaces largely at the second end of the spacer wall; and an edge electrode located over one of the edge surfaces.

62. A spacer situated between a faceplate structure and a backplate structure of a flat panel display so as to resist external forces exerted on the flat panel display, the spacer comprising:

a spacer wall having (a) a first edge surface adjacent a selected one of the faceplate and backplate structures, (b) a second edge surface opposite the first edge surface and adjacent the remaining one of the faceplate and backplate structures, (c) a first face surface extending between the edge surfaces, (d) a second face surface opposite the first face surface and extending between the edge surfaces, (e) a first end, and (f) a second end distal from the first end;

a first spacer foot located over the first face surface near the first end of the spacer wall and having a support surface largely co-planar with the first edge surface;

a second spacer foot located over a specified one of the face surfaces near the second end of the spacer wall and having a support surface largely co-planar with the first edge surface, the first and second spacer feet comprising one or more of ceramic, glass, and glass frit; and an edge electrode located over one of the edge surfaces.

63. The spacer of claim 62, further comprising a third spacer foot located over the second face surface near the first end of the spacer wall and having a support surface largely co-planar with the first edge surface.

64. The spacer of claim 63, further comprising a fourth spacer foot located over the non-specified face surface near the second end of the spacer wall and having a support surface largely co-planar with the first edge surface.

65. The spacer of claim 62, further comprising one or more face electrodes, each located over part of one of the face surfaces.

66. The spacer of claim 62, wherein the selected structure is the faceplate structure.

67. The spacer of claim 62, wherein the specified face surface is the first face surface.

68. The spacer of claim 67, wherein the selected structure is the faceplate structure.

69. The spacer of claim 62, wherein:

the edge electrode constitutes a first edge electrode located over the first edge surface; and the spacer further comprises a second edge electrode located over the second edge surface.

70. The spacer of claim 69, wherein:

the first edge electrode contacts the faceplate structure; and the second edge electrode contacts the backplate structure.

71. The spacer of claim 70, further comprising one or more face electrodes, each located over part of one of the face surfaces.

72. A spacer situated between a faceplate structure and a backplate structure of a flat panel display so as to resist external forces exerted on the flat panel display, the spacer comprising:

a spacer wall having (a) a first edge surface adjacent a selected one of the faceplate and backplate structures, (b) a second edge surface opposite the first edge surface and adjacent the remaining one of the faceplate and backplate structures, (c) a first face surface extending between the edge surfaces, (d) a second face surface opposite the first face surface and extending between the edge surfaces, (e) a first end. and (f) a second end distal from the first end;

a first spacer foot located over the first face surface near the first end of the spacer wall and having a support surface largely co-planar with the first edge surface;

a second spacer foot located over the second face surface near the second end of the spacer wall and having a support surface largely co-planar with the first edge surface; and an edge electrode located over one of the edge surfaces.

73. The spacer of claim 72, further comprising one or more face electrodes, each located over part of one of the face surfaces.

74. The spacer of claim 73, wherein the selected structure is the faceplate structure.

75. The spacer of claim 72, wherein:

the edge electrode constitutes a first edge electrode located over the first edge surface; and the spacer further comprises a second edge electrode located over the second edge surface.

76. The spacer of claim 75, wherein:

the first edge electrode contacts the faceplate structure; and the second edge electrode contacts the backplate structure.

77. The spacer of claim 76, further comprising one or more face electrodes, each located over part of one of the face surfaces.

* * * * *